(12) United States Patent
Ryu

(10) Patent No.: US 12,308,676 B2
(45) Date of Patent: May 20, 2025

(54) ELECTRONIC DEVICE CAPABLE OF IDENTIFYING A STATE OF A RECHARGEABLE BATTERY

(71) Applicant: Samsung Electronics Co., Ltd., Gyeonggi-do (KR)

(72) Inventor: Jisu Ryu, Gyeonggi-do (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 663 days.

(21) Appl. No.: 17/671,935

(22) Filed: Feb. 15, 2022

(65) Prior Publication Data

US 2022/0263326 A1    Aug. 18, 2022

Related U.S. Application Data

(63) Continuation of application No. PCT/KR2022/002077, filed on Feb. 11, 2022.

(30) Foreign Application Priority Data

Feb. 16, 2021    (KR) .................... 10-2021-0020245

(51) Int. Cl.
  *H02J 7/00*      (2006.01)
  *G01R 31/3835*   (2019.01)
  *H02J 50/12*     (2016.01)

(52) U.S. Cl.
  CPC ........ *H02J 7/0029* (2013.01); *G01R 31/3835* (2019.01); *H02J 7/0049* (2020.01);
  (Continued)

(58) Field of Classification Search
  CPC .................. H02J 7/0029; H02J 7/0047
  (Continued)

(56) References Cited

U.S. PATENT DOCUMENTS

2010/0244779 A1    9/2010  Hara
2011/0309801 A1   12/2011  Kubota et al.
(Continued)

FOREIGN PATENT DOCUMENTS

JP    2009-95076 A    4/2009
JP    2013-17314 A    1/2013
(Continued)

OTHER PUBLICATIONS

International Search Report dated Jun. 7, 2022.
Written Opinion dated Jun. 7, 2022.

*Primary Examiner* — Drew A Dunn
*Assistant Examiner* — Ahmed H Omar
(74) *Attorney, Agent, or Firm* — Cha & Reiter, LLC

(57) ABSTRACT

According to certain embodiments, an electronic device comprises: a rechargeable battery configured to supply power to the electronic device; a processor connected to the battery; and memory storing a plurality of executable instructions, wherein the execution of the executable instructions by the processor causes performing a plurality of operations, wherein the plurality of operations comprises: charging the battery based on a target voltage level, wherein the target voltage level is based on a number of times the rechargeable battery has been previously charged, detecting that the voltage of the rechargeable battery is maintained within a range of levels lower than the target level, and protecting the battery in response to detecting.

12 Claims, 15 Drawing Sheets

(52) U.S. Cl.
CPC ...... *H02J 7/0063* (2013.01); *H02J 7/007182* (2020.01); *H02J 50/12* (2016.02)

(58) Field of Classification Search
USPC .................................................. 320/134, 108
See application file for complete search history.

(56) References Cited

U.S. PATENT DOCUMENTS

| | | | |
|---|---|---|---|
| 2016/0197506 A1* | 7/2016 | Abiru .................... | H01M 10/46 |
| | | | 320/134 |
| 2016/0301226 A1* | 10/2016 | Matsumura ........... | H02J 7/0029 |
| 2018/0041254 A1* | 2/2018 | Lee ........................ | H02J 50/40 |
| 2020/0174083 A1 | 6/2020 | Seo et al. | |
| 2023/0228820 A1* | 7/2023 | Liu .................... | H01M 10/488 |
| | | | 702/63 |

FOREIGN PATENT DOCUMENTS

| | | |
|---|---|---|
| KR | 10-1016825 B1 | 2/2011 |
| KR | 10-2016-0130863 A | 11/2016 |
| KR | 10-2019-0096673 A | 8/2019 |
| WO | 2010/144885 A1 | 12/2010 |

\* cited by examiner

ELECTRONIC DEVICE CAPABLE OF IDENTIFYING A STATE OF A RECHARGEABLE BATTERY

CROSS-REFERENCE TO RELATED APPLICATION

This application is a continuation of International Application No. PCT/KR2022/002077 designating the United States, filed on Feb. 11, 2022, in the Korean Intellectual Property Receiving Office and claiming priority to Korean Patent Application No. 10-2021-0020245, filed on Feb. 16, 2021, in the Korean Intellectual Property Office, the disclosures of which are incorporated by reference herein in their entireties.

TECHNICAL FIELD

The disclosure relates to an electronic device and a method of controlling the same, and more particularly to an electronic device capable of identifying a state of a rechargeable battery, and a method of controlling the same.

BACKGROUND

Various types of electronic devices have been developed and distributed. The various types of electronic devices can include, but are not limited to, smartphones, smart pads (tablet computers), personal digital assistants (PDA), etc.

The electronic device may include a rechargeable battery for supplying operation power. The rechargeable battery can be charged by an external power source, and is generally charged up to about 60% of its total capacity when the electronic device is released.

The electronic device, including the rechargeable battery may be unused and uncharged for a long period of time between leaving the factory and arriving in the hands of the consumer.

Leaving the rechargeable battery unused and uncharged for a long period of time may cause problems such as rechargeable battery damage, reduction of the life of the rechargeable battery, and even an accident.

SUMMARY

The disclosure is to provide an electronic device, which can identify whether when the rechargeable battery is left unattended for a long period of time and prevent problems associated therewith.

According to certain embodiments, an electronic device comprises: a rechargeable battery configured to supply power to the electronic device; a processor connected to the battery; and memory storing a plurality of executable instructions, wherein the execution of the executable instructions by the processor causes performing a plurality of operations, wherein the plurality of operations comprises: charging the battery based on a target voltage level, wherein the target voltage level is based on a number of times the rechargeable battery has been previously charged, detecting that the voltage of the rechargeable battery is maintained within a range of levels lower than the target level, and protecting the battery in response to detecting.

According to certain embodiments, detecting comprises detecting that the voltage has not changed in excess of a predetermined threshold over a certain period of time.

According to certain embodiments, the electronic device further comprises a display, wherein the processor is configured to display a user interface (UI) indicating a charged proportion of the battery, wherein the UI indicates a fully charged state of the rechargeable battery while the voltage level of the rechargeable battery is within the range of levels lower than the target level.

According to certain embodiments, the electronic device further comprises a display, wherein the processor is configured to control the display to display an indicator indicating a charged proportion of the rechargeable battery, and wherein the indicator is increased a preset percentage per a given unit time, while the voltage level of the rechargeable battery is within the range of levels lower than the target level.

According to certain embodiments, the processor detects the voltage level of the rechargeable battery is within the range of levels lower than the target level, based on the voltage of the battery reaching a preset percentage of the target voltage level.

According to certain embodiments, the electronic device further comprises a display, wherein the processor protects the battery by controlling the display to display a user interface (UI) showing charging interruption of the battery or a battery warning.

According to certain embodiments, the processor protects the battery by changing the target voltage level of the battery.

According to certain embodiments, an electronic device comprises: a wireless charging module configured to wirelessly transmit power; and a processor configured to: perform wireless charging for a rechargeable battery of an external apparatus through the wireless charging module, and detecting that the voltage of the rechargeable battery is maintained within a range of levels lower than a target level based on identification that a charging current for the wireless charging is lower than or equal to a preset reference current level, and protecting the rechargeable battery of the external apparatus.

According to certain embodiments, an electronic device comprises a display, wherein the processor protects the battery by controlling the display to output a user interface (UI) indicating that the rechargeable battery of the external apparatus needs to be replaced.

According to certain embodiments, a method of controlling an electronic device, comprises: charging a rechargeable battery based on a target voltage level, wherein the target voltage level is based on a number of times the rechargeable battery has been previously charged; detecting that the voltage of the rechargeable battery is maintained within a range of levels lower than the target level; and protecting the battery in response to detecting.

According to certain embodiments, detecting comprises detecting that the voltage has not changed in excess of a predetermined threshold over a certain period of time.

According to certain embodiments, the method further comprises displaying a user interface (UI) indicating a charged proportion of the battery, wherein the UI indicates a fully charged state of the battery.

According to certain embodiments, the method further comprises displaying an indicator indicating a charged proportion of the rechargeable battery, and wherein the indicator is increased a preset percentage per a given time, while the voltage level of the rechargeable battery is within the range of levels lower than the target level.

According to certain embodiments, detecting the voltage level of the rechargeable battery is within the range of levels lower than the target level comprises detecting based on the voltage of the battery reaching a preset percentage of the target voltage level.

According to certain embodiments, a method of controlling an electronic device, comprises: performing wireless charging for a rechargeable battery of an external apparatus; detecting that the voltage of the rechargeable battery is maintained within a range of levels lower than the target level based on identification that a charging current for the wireless charging is lower than or equal to a preset reference current level; and protecting the rechargeable battery of the external apparatus.

With the foregoing electronic device according to the disclosure and the method of controlling the same, it is possible to identify whether the rechargeable battery is left unattended for a long period of time by detecting dynamic scaling, stopping charging of the rechargeable battery, and protecting the rechargeable battery. The foregoing may prevent damage to the rechargeable battery, reduction of the rechargeable battery life, and accidents (now collectively referred to as "damages").

DETAILED DESCRIPTION

Figure 1:
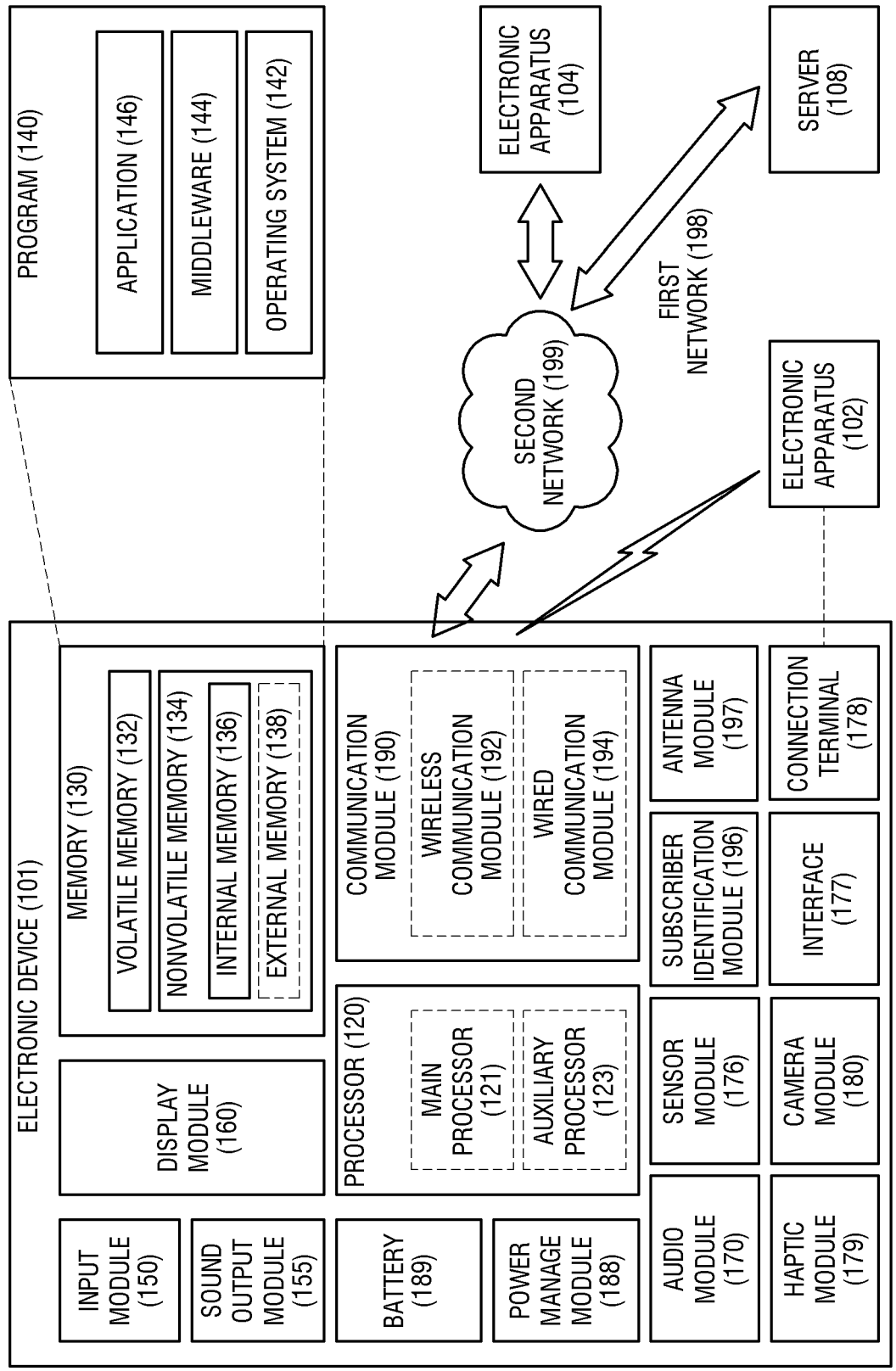
FIG. 1 is a block diagram of an electronic device according to certain embodiments of the disclosure.

Below, certain embodiments will be described in detail with reference to accompanying drawings. In the drawings, like numerals or symbols refer to like elements having substantially the same function, and the size of each element may be exaggerated or reduced for clarity and convenience of description. However, the configurations and functions illustrated in the following embodiments are not to be construed as limiting the scope of this disclosure. In the following descriptions, details that are known to persons having ordinary skill in the art are omitted when unnecessary for describing embodiments herein.

In the following embodiments, terms 'first', 'second', etc. are only used to distinguish one element from another, and singular forms are intended to include plural forms unless otherwise mentioned contextually. In the following embodiments, it will be understood that terms 'comprise', 'include', 'have', etc. do not preclude the presence or addition of one or more other features, numbers, steps, operation, elements, components or combination thereof. In addition, a 'module' or a 'portion' may perform at least one function or operation, be achieved by hardware, software or combination of hardware and software, and be integrated into at least one module. In the disclosure, at least one among a plurality of elements refers to not only all the plurality of elements but also both each one of the plurality of elements excluding the other elements and a combination thereof.

Figure 2:
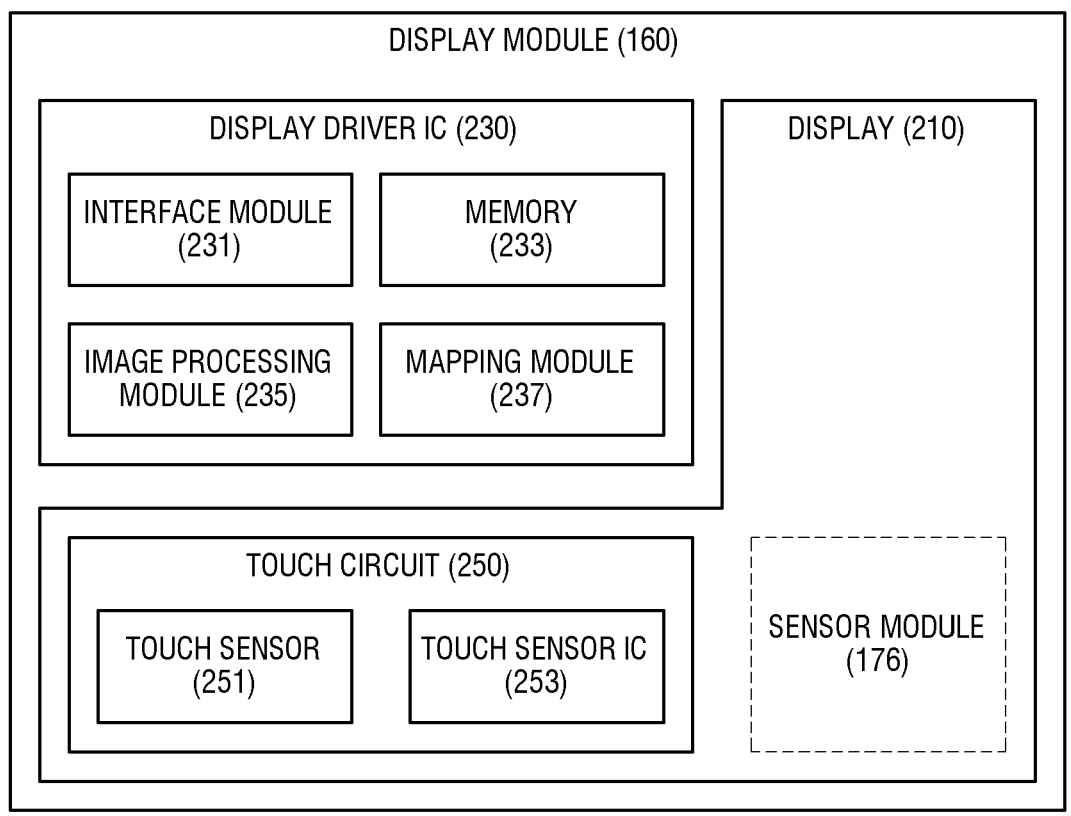
FIG. 2 is a block diagram of a display module according to certain embodiments.

Presented herein embodiments that include electronic device(s) and method(s) for preventing damages as a result of a rechargeable battery that has been left unattended for a long time, or in excess of a certain threshold of time. FIGS. 1 and 2 describe an electronic device 101 with a rechargeable battery 189. The electronic device 101 may include a rechargeable battery 189 that provides power to other electronic components that perform various functions (in addition to a power source). For example, the rechargeable battery 189 (in addition to a power source) may provide power to a processor 120 that executes instructions in a memory 130 causing input and output of data through a display module 160, as shown in FIG. 2. The electronic device may also engage in a phone call or access the internet using communication module 190.

Figure 3:
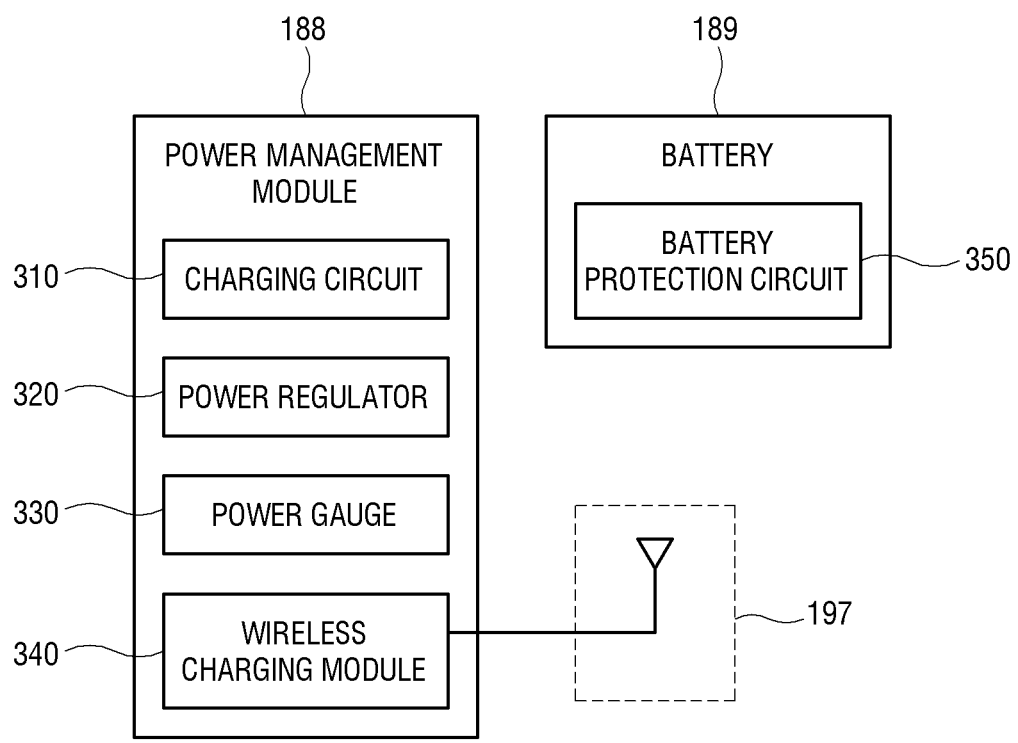
FIG. 3 is a block diagram of a power management module and a rechargeable battery according to certain embodiments.

The electronic device 101 charges the rechargeable battery 189 with an external power source using the power management module 188 as shown in FIG. 3. The external power source can include a power outlet, a USB device, or a wireless power source.

If the electronic device 101 with rechargeable battery 189 has been left unused and is not charged for a long period of time, the rechargeable battery 189 may undergo a phenomena known as "dynamic scaling." The electronic device 101 may be left unused and not charged from time period the electronic device 101 leaves the factory to the time of arriving in the hands of a consumer.

Figure 5:
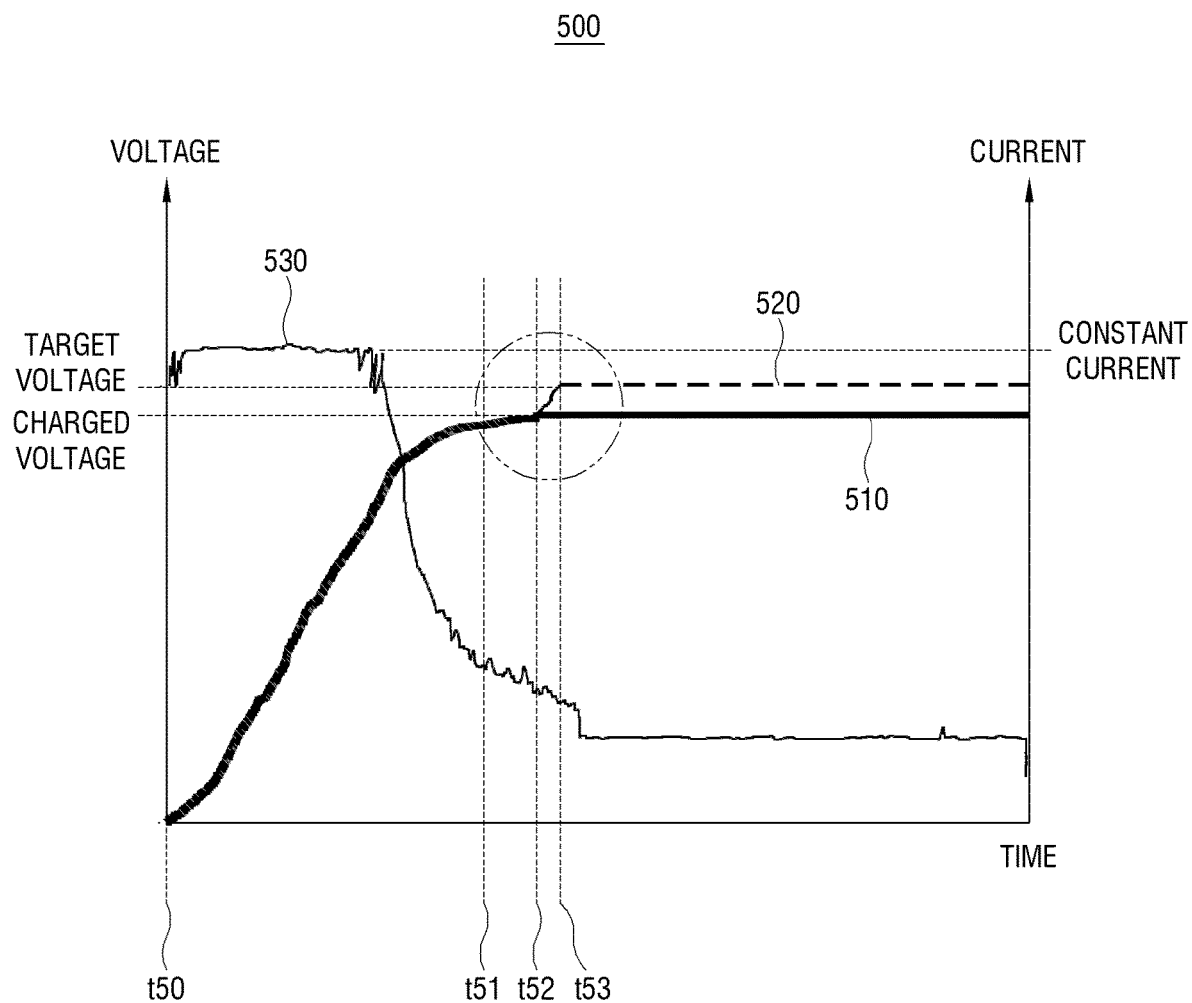
FIGS. 5 and 6 are graphs to show charging control of a rechargeable battery according to an embodiment of the disclosure.

In dynamic scaling, when charging the rechargeable battery 189, the rechargeable battery maintains a level lower than fully recharged. For example, FIGS. 5 and 6 describe the charged voltage as the rechargeable battery is charged. In FIG. 5, a rechargeable battery that has been unused and not charged for a long period of time reaches a particular charged voltage at t51, which is less than the target voltage. Upon reaching the charged voltage, the voltage of the rechargeable battery continues to remain at the same level at t52 and t53 onwards. The charged voltage of the rechargeable battery remains or does not appreciably increase from the charged voltage after t51 and does not attain the target voltage. The charged voltage level attained at t51 is referred to as a "sideway-drifting section." In contrast, in FIG. 6, a normally operating rechargeable battery increases from time t61 to attain the target voltage at time t63. Moreover, shortly after time t63, the current 630 drops and when there is detection of full charge, the current 630 makes a notable downward step.

In the case of the rechargeable battery of FIG. 5, if the charging current 530 remains at the same t53 onwards, current will be provided to the rechargeable battery, but the charge voltage level of the rechargeable battery will not appreciably increase. This can cause damage.

Figure 4:
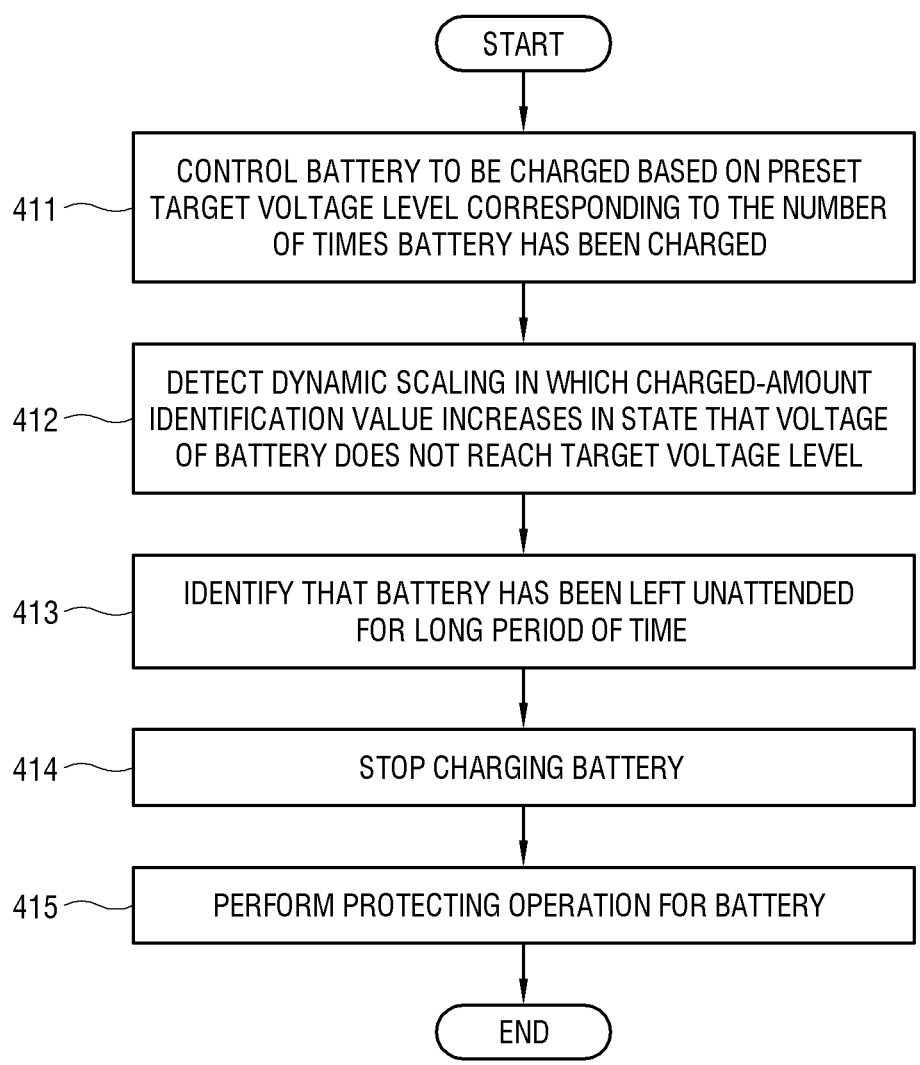
FIG. 4 is a flowchart showing a method of performing a protecting operation for a rechargeable battery in an electronic device according to a first embodiment of the disclosure.

Accordingly, in the method of FIG. 4, the electronic device 101 detects the sideway drifting section has been attained (412), stops charging the rechargeable battery (414) and protects the rechargeable battery (515).

Electronic Device

FIG. 1 is a block diagram of an electronic device 101 according to certain embodiments of the disclosure. The electronic device 101 may include variety of electronic components and a rechargeable battery 189 for providing power to the electronic components when the electronic device 101 is not attached to a power source.

According to certain embodiments of the disclosure, an electronic device 101 may, for example, include various stationary or mobile digital devices such as smartphones, tablet computers, smart pads, smart notes, personal digital assistants (PDA), portable multimedia players, navigation apparatuses, MP3 players, laptop computers, and the like. Alternatively, the electronic device 101 may include wearable apparatuses (also referred to as digital accessories, smart accessories, or Appcessories), which can be worn on a user's body, such as smartwatches, smart bands, wireless headsets (e.g., Bluetooth headsets), etc. Alternatively, the electronic device 101 may include an input device with a remote control or a remote control unit for transmitting a control command to other devices such as a television (TV, e.g., a smart TV), a set-top box, and the like. Alternatively, the electronic device 101 may include various kinds of devices provided as things or smartthings operating based on Internet of things (IoT) technology, such as healthcare, automatic meter reading, smart home, a smart car, etc., and the electronic device 101 may include sensors for detecting surrounding environments in order to perform the operations of the respective devices.

The electronic device 101 refers to an apparatus with a built-in rechargeable battery 189 or a detachable rechargeable battery to supply operation power, and the rechargeable battery 189 may include a secondary cell, a secondary battery, or a rechargeable battery that can be charged with external power. The electronic device 101 may include a connection terminal 178 or an antenna module 197 to receive power by connecting with an external power source.

The electronic device 101 may communicate with an electronic device 102 through a first network 198 (e.g., a short-range wireless communication network) in a network environment, or communicate with at least one of an electronic device 104 or a server 108 through a second network 199 (e.g., a long-range wireless communication network). The electronic device 101 may communicate with the electronic device 104 through the server 108.

The electronic device 101 may include a processor 120, a memory 130, an input module 150, a sound output module 155, a display module 160, an audio module 170, a sensor module 176, an interface 177, a connection terminal 178, a haptic module 179, a camera module 180, a power management module 188, a rechargeable battery 189, a communication module 190, a subscriber identification module 196, or the antenna module 197. According to an alternative embodiment, the electronic device 101 may exclude at least one (e.g., the connection terminal 178) among these elements, or may additionally include one or more other elements. According to an alternative embodiment, some (e.g., the sensor module 176, the camera module 180, or the antenna module 197) among these elements may be integrated into one element (e.g., the display module 160).

The processor 120 may, for example, execute software (e.g., a program 140) to control at least one of other elements (e.g., a hardware or software element) of the electronic device 101 connected to the processor 120, and perform various data processing or operations. According to an embodiment, as at least a part of the data processing or operations, the processor 120 may store a command or data received from other elements (e.g., the sensor module 176 or the communication module 190) in a volatile memory 32, processes the command or data stored in the volatile memory 32, and store result data in a nonvolatile memory 34. The processor 120 may include a main processor 121 (e.g., a central processing unit or an application processor), or an auxiliary processor 123 (e.g., a graphic processor, a neural processing unit (NPU), an image signal processor, a sensor hub processor, or a communication processor) operating independently of or in conjunction with the main processor 121. For example, when the electronic device 101 includes the main processor 121 and the auxiliary processor 123, the auxiliary processor 123 may be configured to use less power than the main processor 121, or to be specialized for a designated function. The auxiliary processor 123 may be provided separately from the main processor 121 or as a part of the main processor 121.

The auxiliary processor 123 may, for example, control at least some of functions or states related to at least one element (e.g., the display module 160, the sensor module 176, or the communication module 190) among the elements of the electronic device 101, instead of the main processor 121 while the main processor 121 is inactive (e.g., sleeping) or in conjunction with the main processor 121 while the main processor 121 is active (e.g., running an application). The auxiliary processor 123 (e.g., the image signal processor or the communication processor) may be provided as a part of other functionally related elements (e.g., the camera module 180 or the communication module 190). The auxiliary processor 123 (e.g., the neural processing unit) may include a hardware structure specialized for processing an artificial intelligence (AI) model. The AI model may be created through machine learning. Such learning may, for example, be performed in the electronic device 101 itself, on which the AI model is applied, or be performed through a separate server (e.g., the server 108). The learning algorithm may, for example, include supervised learning, unsupervised learning, semi-supervised learning or reinforcement learning, but is not limited to these examples. The AI model may include a plurality of artificial neural network layers. The artificial neural network may include a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-networks, or one of combinations between two or more networks aforementioned, but is not limited to these examples. Besides the hardware structure, the AI model may additionally or alternatively include a software structure.

The term "processor" shall be understood to refer to both the singular and plural contexts.

The memory 130 may be configured to store various pieces of data to be used by at least one element (e.g., the processor 120 or the sensor module 176) of the electronic device 101. The data may, for example, include the software (e.g., the program 140), and input data or output data with regard to a command related to the software. The memory 130 may include the volatile memory 32 or the nonvolatile memory 34.

The program 140 may be stored as the software in the memory 130, and may for example include an operating system 142 for controlling one or more resources of the electronic device 101, a middleware 144, or an application 146 executable on the operating system 142.

The middleware 144 may provide various functions to the application 146 so that functions or information provided from one or more resources of the electronic device 101 can be used by the application 146. The middleware 144 may, for example, include a power manager. The power manager may, for example, manage the capacity, temperature or power of the rechargeable battery 189, and identify or provide relevant information needed for the operations of the electronic device 101 based on the corresponding information among pieces of information about the capacity, temperature or power of the rechargeable battery 189. The power manager may interwork with a basic input/output system (BIOS) (not shown) of the electronic device 101.

The input module 150 may receive a command or data, which will be used by the element (e.g., the processor 120) of the electronic device 101, from the outside (e.g., a user) of the electronic device 101. The input module 150 may, for example, include a microphone, a mouse, a keyboard, a key (e.g., a button), or a digital pen (e.g., a stylus pen).

The sound output module 155 may output a sound signal to the outside of the electronic device 101. The sound output module 155 may, for example, include a loudspeaker or a receiver. The loudspeaker may be used for general purposes such as multimedia playback or recording playback. The receiver may be used to receive an incoming call. The receiver may be provided separately from the loudspeaker or as a part of the loudspeaker.

The display module 160 may visually provide information to the outside (e.g., a user) of the electronic device 101. The display module 160 may, for example, include a display, a hologram device or a projector, and a control circuit for controlling a corresponding one of the display, the hologram device or the projector. The display module 160 may include a touch sensor configured to detect a touch, or a pressure sensor configured to detect the strength of a force generated by the touch.

The audio module 170 may be configured to convert a sound into an electric signal, or reversely convert the electric signal into the sound. The audio module 170 may obtain a sound through the input module 150, or output a sound through the sound output module 155 or an external electronic device (e.g., the electronic device 102) (e.g., the loudspeaker or a headphone) directly or wirelessly connected to the electronic device 101.

The sensor module 176 may be configured to detect operating states (e.g., power or temperature) of the electronic device 101, or external environment states (e.g., a user's state), and generate electric signals or data values corresponding to the detected states. The sensor module 176 may, for example, include a gesture sensor, a gyro sensor, a barometer, a magnetic sensor, an accelerometer, a grip sensor, a proximity sensor, a color sensor, an infrared (IR) sensor, a biometric sensor, a temperature sensor, a humidity sensor, or an illuminance sensor.

The interface 177 may support one or more designated protocols that the electronic device 101 may use to be directly or wirelessly connected to an external electronic device (e.g., the electronic device 102). The interface 177 may, for example, include a high-definition multimedia interface (HDMI), a universal serial bus (USB) interface, a secure digital (SD) card interface, or an audio interface.

The connection terminal 178 may include a connector through which the electronic device 101 can physically connect with an external electronic device (e.g., the electronic device 102). The connection terminal 178 may, for example, include an HDMI connector, a USB connector, an SD card connector, or an audio connector (e.g., a headphone connector). The electronic device 101 may be connected to an external power source so that the rechargeable battery 189 can be charged through the connection terminal 178.

The haptic module 179 may be configured to convert an electric signal into a mechanical stimulus (e.g., vibration or movement) that a user can perceive through his/her tactile or kinetic senses. The haptic module 179 may, for example, include a motor, a piezoelectric device, or an electrical stimulation device.

The camera module 180 may be configured to take a still image or a moving image. The camera module 180 may include one or more lenses, image sensors, image signal processors, or flashes.

The power management module 188 may manage power supplied to the electronic device 101. The power management module 188 may, for example, be provided as at least a part of a power management integrated circuit (PMIC).

The rechargeable battery 189 may supply power to at least one element of the electronic device 101. The rechargeable battery 189 may, for example, include a rechargeable secondary cell, and further include a non-rechargeable primary cell or a fuel cell.

The communication module 190 may be configured to establish a direct (e.g., wired) communication channel or a wireless communication channel between the electronic device 101 and the external electronic device (e.g., the electronic device 102, the electronic device 104, or the server 108), and support communication through the established communication channel. The communication module 190 may include one or more communication processors that operate independently of the processor 120 (e.g., the application processor) and support the direct (e.g., wired) communication or the wireless communication. The communication module 190 may include a wireless communication module 192 (e.g., a cellular communication module, a short-range wireless communication module, or a global navigation satellite system (GNSS) communication module), or a wired communication module 194 (e.g., a local area network (LAN) communication module, or a power line communication module). Among these communication modules, a corresponding communication module may communicate with an external electronic device 104 through the first network 198 (e.g., Bluetooth, Wi-Fi direct, infrared data association (IrDA) or the like short-range communication network) or the second network 199 (e.g., a legacy cellular network, a 5G network, the next-generation communication network, the Internet, a computer network (e.g., LAN or wide area network (WAN)) or the like long-range communication network). Such various types of communication modules may be integrated into one element (e.g., a single chip), or may be provided as a plurality of elements (e.g., a plurality of chips) separated from each other. The wireless communication module 192 may identify or authenticate the electronic device 101 in the first network 198, the second network 199 or the like communication network, based on subscriber information (e.g., international mobile subscriber identity (IMSI)) stored in the subscriber identification module 196.

The wireless communication module 192 may support the 5G network after the 4G network and the next-generation communication technology, for example, new radio (NR) access technology. The NR access technology may support high-capacity and high-speed data transmission (enhanced mobile broadband (eMBB)), terminal power minimization and multiple terminal access (massive machine type communications (mMTC)), or ultra-reliable and low-latency communications (URLLC). The wireless communication module 192 may, for example, support a high frequency band (e.g., a mmWave band) to achieve a high rate of data transmission. The wireless communication module 192 may support various technologies for securing performance in the high frequency band, for example, beamforming, massive multiple-input and multiple-output (MIMO), full dimensional (FD)-MIMO, an array antenna, analog beamforming, a large-scale antenna or the like technologies. The wireless communication module 192 may support various requirements stipulated in the electronic device 101, the external electronic device (e.g., the electronic device 104) or the network system (e.g., the second network 199). The wireless communication module 192 may support a peak data rate (e.g., 20 Gbps or higher) for realizing eMBB, a loss coverage (e.g., 164 dB or below) for realizing mMTC, or U-plane latency (e.g., a downlink (DL) and an uplink (UL) lower than 0.5 ms, or a round trip lower than 1 ms) for realizing URLLC.

The antenna module 197 may transmit or receive a signal or power to or from the outside (e.g., the external electronic device). The antenna module 197 may include an antenna with a conductor formed on a substrate (e.g., a printed circuit board (PCB)) or a radiator formed of a conductive pattern. The antenna module 197 may include a plurality of antennas (e.g., an array antenna). In this case, at least one antenna suitable for a communication method used in the first network 198, the second network 199 or the like communication network may, for example, be selected by the communication module 190 among the plurality of antennas. The signal or power may be transmitted or received between the communication module 190 and the external electronic device through at least one selected antenna. According to an alternative embodiment, another part (e.g., a radio frequency integrated circuit (RFIC)) may be additionally formed as a part of the antenna module 197 in addition to the radiator.

According to certain embodiments, the antenna module 197 may form an mmWave antenna module. The mmWave antenna module may include a PCB, an RFIC disposed on or adjacent to a first side (e.g., a bottom side) of the PCB and supporting a designated high-frequency band (e.g., a mmWave band), and a plurality of antennas (e.g., an array antenna) disposed on or adjacent to a second side (e.g., a top or lateral side) of the PCB and transmitting the designated high-frequency band.

At least some among the elements may be connected to each other through a communication method between peripheral devices (e.g., a bus, a general-purpose input and output (GPIO), a serial peripheral interface (SPI), or a mobile industry processor interface (MIPI)).

According to an embodiment, a command or data may be transmitted or received between the electronic device 101 and the external electronic device 104 through the server 108 connected to the second network 199. Each external electronic device 102 or 104 may be the same or different type of apparatus as or from the electronic device 101. According to an embodiment, each external electronic device 102 or 104 may include at least some among the elements of the electronic device 1010 shown in FIG. 1, and may additionally include other elements. According to an embodiment, all or some of the operations executed in the electronic device 101 may be performed in one or more external electronic device among the external electronic device 102, 104 or 108. For example, when the electronic device 101 has to perform a certain function or service automatically or in response to a request from a user or another apparatus, the electronic device 101 may request one or more external electronic device to perform at least a part of the function or service instead of or in addition to autonomously performing the function or service. One or more external electronic devices that have received the request may execute at least a part of the requested function or service or an additional function or service related to the request, and transmit a result of the execution to the electronic device 101. The electronic device 101 directly or additionally processes the result, and provide the processed result as at least a part of the response. To this end, for example, cloud computing, distributed computing, mobile edge computing (MEC), or client-server computing technologies may be used. The electronic device 101 may, for example, provide the ultralow-latency service based on the distributed computing or the MEC. According to an alternative embodiment, the external electronic device 104 may include an IoT device. The server 108 may be an intelligent server based on machine learning and/or neural network. The external electronic device 104 or the server 108 may be included in the second network 199. The electronic device 101 may be applied to an intelligent service (e.g., smart home, a smart city, a smart car, or healthcare) based on the 5G communication technology and the IoT related technologies.

The electronic components can provide numerous function that receive input and provide output through the display module 160.

FIG. 2 is a block diagram of a display module according to certain embodiments.

Referring to FIG. 2, the display module 160 may include a display 210, and a display driver integrated circuit (DDI) 230 for controlling the display 210. The DDI 230 may include an interface module 231, a memory 233 (e.g., a buffer memory), an image processing module 235, or a mapping module 237. The display module 160 may include a display 210 and a touch circuit 250. The display 210 may provide graphical user interfaces that provide output and receive input. The user can touch the display at particular location to interact with objects displayed on the display 210 to provide inputs. A touch circuit 250 detects the user's touch and location of the user's touch.

The DDI 230 may, for example, receive image data, or image information including an image control signal corresponding to a command for controlling the image data from other elements of the electronic device 101 through the interface module 231. For example, The image information may be received from the processor 120 (e.g., the main processor 121 (e.g., the application processor) or the auxiliary processor 123 (e.g., the graphic processor) operating independently of the function of the main processor 121). The DDI 230 may communicate with a touch circuit 250 or the sensor module 176, etc. through the interface module 231. Further, the DDI 230 may store at least a part of the received image information in the memory 233, for example, in units of frames. The image processing module 235 may, for example, apply a preprocess or a postprocess (e.g., resolution, brightness or size adjustment) to at least a part of the image data based on at least one of the characteristics of the image data or the characteristics of the display 210. The mapping module 237 may generate a voltage level or current level corresponding to the image data preprocessed or postprocessed through the image processing module 235. The voltage level or the current level may, for example, be generated based on at least a part of the properties of the pixels of the display 210 (e.g., the array of pixels (an RGB stripe or pentile structure), or the size of each of sub pixels). At least some pixels of the display 210 may, for example, be driven based on at least a part of the voltage level or the current level, so that visual information (e.g., a text, an image or an icon) corresponding to the image data can be displayed through the display 210.

The display module 160 may further include the touch circuit 250. The touch circuit 250 may include a touch sensor 251, and a touch sensor IC 253 for controlling the touch sensor 251. The touch sensor IC 253 may, for example, control the touch sensor 251 to detect a touch input or a hovering input on a specific location of the display 210. For example, the touch sensor IC 253 may detect the touch input or the hovering input by measuring change in a signal (e.g., voltage, light quantity, resistance or the amount of electric charge) with regard to the specific location on the display 210. The touch sensor IC 253 may provide information (e.g., location, area, pressure, or time) about the detected touch input or hovering input to the processor 120. According to an embodiment, at least a part (e.g., the touch sensor IC 253) of the touch circuit 250 may be included as a part of the DDI 230 or the display 210, or as a part of another element (e.g., the auxiliary processor 123) placed outside the display module 160.

The display module 160 may include at least one sensor (e.g., a fingerprint sensor, an iris sensor, a pressure sensor or an illuminance sensor) of the sensor module 176, or a control circuit corresponding to this sensor. In this case, the at least one sensor or the control circuit corresponding to this sensor may be embedded in a part (e.g., the display 210 or the DDI 230) of the display module 160 or a part of the touch circuit 250. For example, when the sensor module 176 embedded in the display module 160 includes the biometric sensor (e.g., the fingerprint sensor), the biometric sensor may obtain biometric information (e.g., a fingerprint image) related to a touch input through a partial region of the display 210. Alternatively, when the sensor module 176 embedded in the display module 160 includes the pressure sensor, the pressure sensor may obtain pressure information related to a touch input through a partial region or the whole region of the display 210. The touch sensor 251 or the sensor module 176 may be disposed between pixels of a pixel layer of the display 210, or disposed above or below the pixel layer.

The electronic components, such as the display module 160, processor 120, among many others can receive power from either a power source or the rechargeable battery 189.

FIG. 3 is a block diagram of a power management module and a rechargeable battery according to certain embodiments.

The electronic device 101 can receive power from a power source. However, receiving power from a power source limits the mobility of the electronic device 101. Accordingly, the electronic device 101 includes a rechargeable battery 189. However, the rechargeable battery 189 stores a limited supply of power and needs to be recharged at regularly.

Referring to FIG. 3, the power management module 188 may include a charging circuit 310, a power regulator 320, a power gauge 330, or a wireless charging module 340. The charging circuit 310 may charge the rechargeable battery 189 with power supplied form an external power source of the electronic device 101. The charging circuit 310 may select a charging method (e.g., normal charging or fast charging) based on at least some of the kinds of external power sources (e.g., a power adapter, a USB or wireless charging), power outputs (e.g., higher than about 20 W) suppliable from the external power source, or the characteristics of the rechargeable battery 189, and charge the rechargeable battery 189 based on the selected charging method. The external power source may be connected to the electronic device 101 by, for example, a wire through the connection terminal 178, or wirelessly through the antenna module 197.

The power regulator 320 may, for example, regulate a voltage level or current level of the power supplied from the external power source or the rechargeable battery 189, thereby generating a plurality of powers different in voltage or current level. The power regulator 320 may regulate the power of the external power source or the rechargeable battery 189 into voltage or current levels respectively suitable for some elements among the elements included in the electronic device 101. The power regulator 320 may be provided in the form of a low drop out (LDO) regulator or a switching regulator. The power gauge 330 may measure use state information about the rechargeable battery 189 (e.g., the capacity, charging/discharging times, voltages, or temperature of the rechargeable battery 189).

The power management module 188 may, for example, use the charging circuit 310, the power regulator 320, or the power gauge 330 in order to identify state-of-charge information (e.g., the life, overvoltage, undervoltage, overcurrent, overcharge, over-discharge, overheated, short-circuited, or swelling) related to the charge of the rechargeable battery 189 based on a least a part of the measured use state information. The power management module 188 may identify whether the rechargeable battery 189 is normal or abnormal based on at least a part of the identified state-of-charge information. When it is identified that the rechargeable battery 189 is abnormal, the power management module 188 may control the charge of the rechargeable battery 189 (e.g., lower the charging current or voltage level or stop the charging). According to an embodiment, at least some functions among the functions of the power management module 188 may be carried out by an external control device (e.g., the processor 120).

The processor 120 may, for example, execute a power management program (e.g., a power management application or a power manager) to thereby control the charge of the rechargeable battery 189 (e.g., stop the charging).

The wireless charging module 340 may wirelessly transmit power to the external electronic device 102 (e.g., the mobile phone or the wearable device) through a wireless charging antenna of the antenna module 197, or wirelessly receive power from the external electronic device 102 (e.g., a wireless charging device). The wireless charging module 340 may, for example, support one or more among various wireless charging methods including a magnetic resonance method or a magnetic induction method.

The rechargeable battery 189 according to an embodiment may include a rechargeable battery protection circuit (e.g., a protection circuit module (PCM)) 350. The rechargeable battery protection circuit 350 may perform one or more among various functions (e.g., a previous cutoff function) to prevent deterioration or damage of the rechargeable battery 189. The rechargeable battery protection circuit 350 may be additionally or alternatively provided as at least a part of a battery management system (BMS) that can perform various functions such as cell balancing, measuring the capacity of the rechargeable battery, counting the number of charging/discharging times, measuring temperature, or measuring a voltage level.

According to an embodiment, based on the rechargeable battery 189 identified by the processor 120 as being left unattended for a long period of time, the battery protection circuit 350 may perform the cell balancing with regard to the rechargeable battery 189. The cell balancing may, for example, be carried to make all the battery cells have the same voltage level. The battery protection circuit 350 may apply the balancing to at least one battery cell of the rechargeable battery 189. The battery protection circuit 350 may perform the balancing with regard to the respective battery cells of the rechargeable battery 189.

According to an embodiment, at least a part of the use state information or the state-of-charge information of the rechargeable battery 189 may be measured by a corresponding sensor (e.g., the temperature sensor) of the sensor module 176, the power gauge 330, or the power management module 188. The corresponding sensor (e.g., the temperature sensor) of the sensor module 176 may be included as a part of the battery protection circuit 350, or may be disposed adjacent to the rechargeable battery 189 as a device separated from the battery protection circuit 350.

Preventing Damage

It is noted that the electronic device 101 including rechargeable battery 189 might not be used or charged for a period of time between leaving the factory and arriving in the hands of a consumer. During this time, a phenomena known as dynamic scaling can occur. In dynamic scaling, the rechargeable battery 189 develops a level of voltage known as a "sideway-drifting section." Continuing to normally charge the rechargeable battery 189 after reaching the sideway-drifting section can damage the rechargeable battery, reduce the life of the rechargeable battery, and even cause an accident.

By the method of controlling the electronic device 101 according to certain embodiments of the disclosure, the characteristic of the rechargeable battery 189, for example, a charging voltage, a residual voltage or a charging current, etc. of the rechargeable battery is detected to identify whether the rechargeable battery 189 has been left unattended for a long period of time. If so, the charging is stopped or previous cut off, thereby protecting the rechargeable battery 189.

Figure 6:
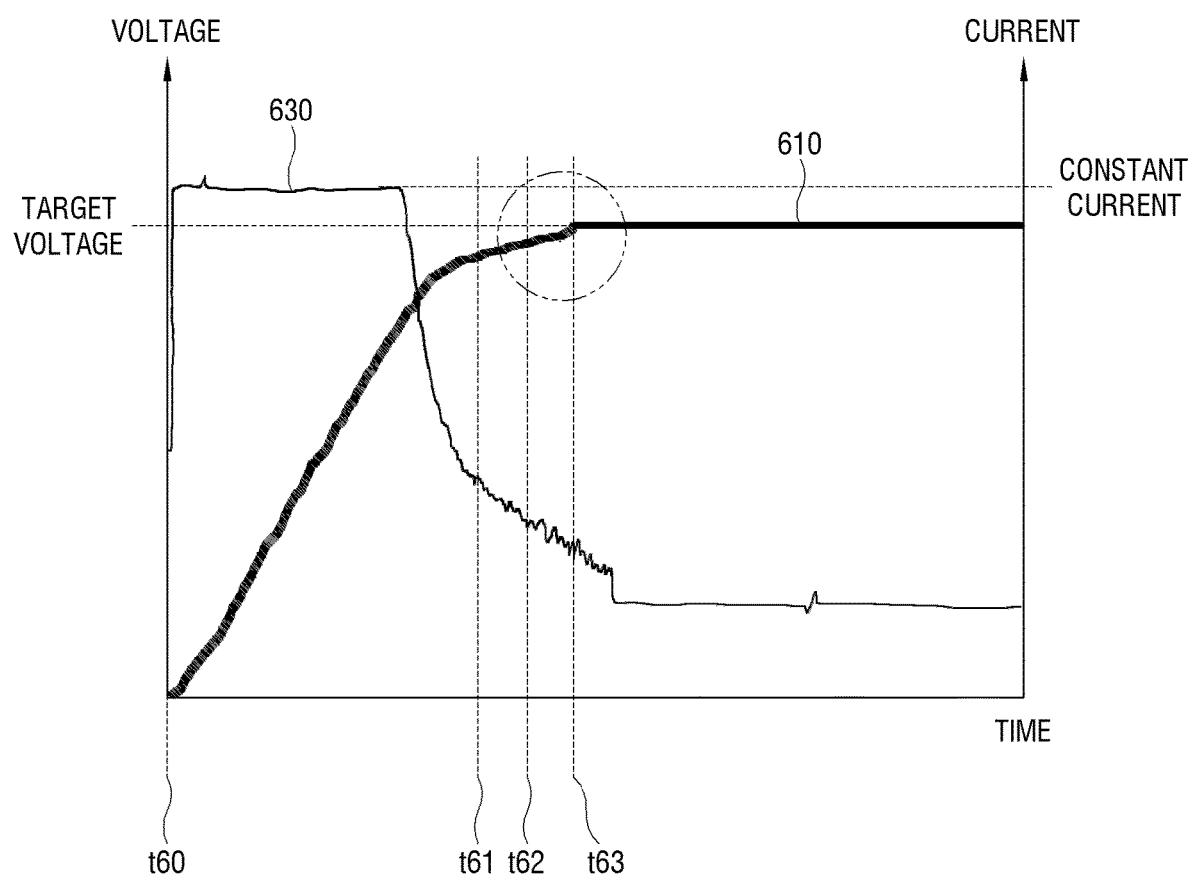
Figure 7:
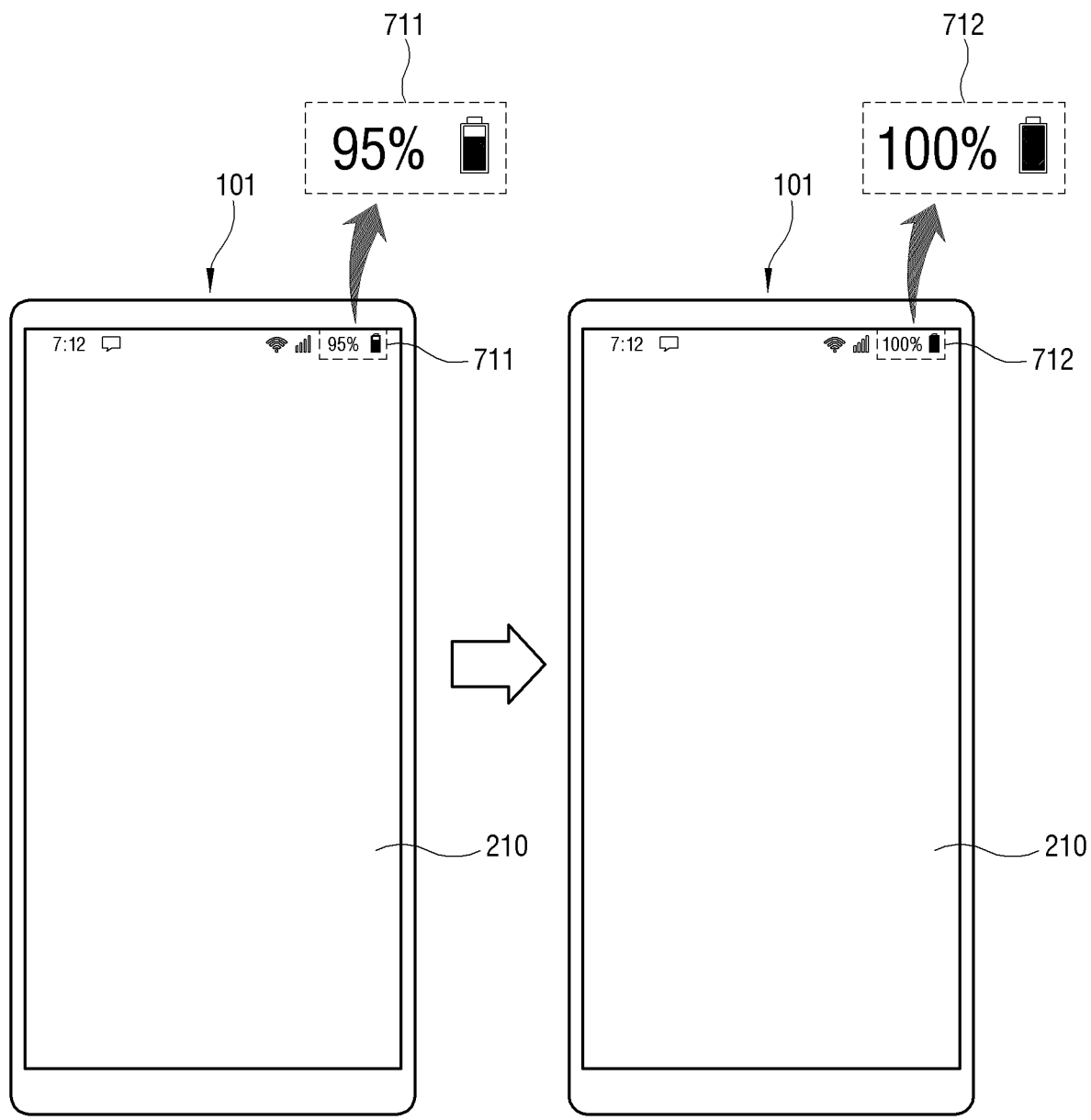
FIG. 7 illustrates a user interface (UI) that shows a charged state of in an electronic device according to an embodiment of the disclosure.
Figure 8:
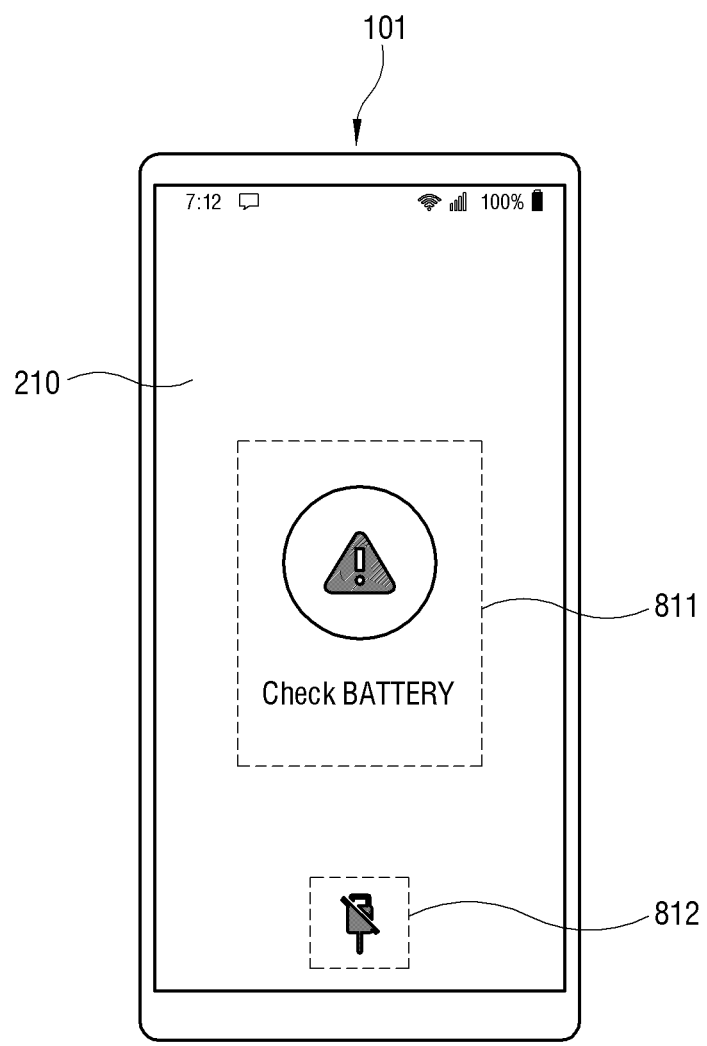
FIG. 8 illustrates a protecting operation for a rechargeable battery in an electronic device according to an embodiment of the disclosure.

FIG. 4 is a flowchart showing a method of performing a protecting operation for a rechargeable battery in an electronic device according to a first embodiment of the disclosure. FIGS. 5 and 6 are graphs to show charging control of a rechargeable battery according to an embodiment of the disclosure, in which FIG. 5 shows a case where the rechargeable battery has been left unattended for a long period of time, and FIG. 6 shows a case where the rechargeable battery is normal. FIG. 7 illustrates a user interface (UI) that shows a charged state of in an electronic device according to an embodiment of the disclosure, and FIG. 8 illustrates a protecting operation for a rechargeable battery in an electronic device according to an embodiment of the disclosure.

Referring to FIG. 4, at operation 411, the processor 120 of the electronic device 101 according to an embodiment may control the rechargeable battery 189 to be charged based on a target voltage level previously set corresponding to the number of charging times, i.e., a charging cycle of the rechargeable battery 189 when an external charging power source (e.g., a charger) is connected to the electronic device 101.

The processor 120 may, as shown in the following Table 1, identify a set target voltage level (a set voltage level) according to the number of times the rechargeable battery 189 has been previously charged. The processor 120 may cause charging of the rechargeable battery 189 based on the identified target voltage level. The number of times the rechargeable battery 189 has been charged may, for example, be measured by the battery protection circuit 350, and data about the target voltage levels according to the number of charging times may be previously stored in the memory 130 in the stage of manufacturing the electronic device 101.

TABLE 1

| | Charging times | | | | |
|---|---|---|---|---|---|
| | 0~299 | 300~399 | 400~699 | 700~999 | 1000 or more |
| Target voltage level | 4.38 V | 4.36 V | 4.34 V | 4.32 V | 4.27 V |

When the rechargeable battery 189 is charged in the operation 411, the rechargeable battery 189 is increased in voltage based on the charging control. Here, the voltage of the rechargeable battery 189 may be measured by the corresponding sensor of the sensor module 176, the power gauge 330, or the power management module 188 as described above.

The increase in the voltage of the rechargeable battery 189 is illustrated in the graphs 500 and 600 shown in FIGS. 5 and 6. Referring to FIGS. 5 and 6, the graphs 500 and 600 shows voltage and current in ordinates, and time in abscissae, in which the voltages 510 and 610 gradually increase as time elapses from charging start points of time t50 and t60.

Based on the measured voltage of the rechargeable battery 189, the processor 120 may, as shown in FIG. 7, control the display 210 to display a UI 711. The UI 711 may, for example, include a charged percentage (%) of the rechargeable battery 189 (i.e., a charged percentage item) and an icon shaped like a battery (i.e., a battery-shaped icon), but is not limited thereto.

The processor 120 may identify the charged-amount identification value based on the measured voltage of the battery 189, and display the state-of-charge of the battery 189 on the display 210 based on the identified charged-amount identification value.

Referring back to FIG. 4, at operation 412, the processor 120 may detect dynamic scaling. The processor 120 may detect dynamic scaling by detecting that the voltage of the rechargeable battery 189 has (1) maintained within a range of levels that is (2) lower than a target voltage level, and (3) in spite of further charging.

The processor 120 may identify a section in which the voltage of the rechargeable battery 189 is maintained within a range of levels lower than the target voltage level, after continuing to charge the battery 189 in the operation 411.

The foregoing can be detected by measuring the voltage level of the rechargeable battery 189 while charging the rechargeable battery. When the voltage of the rechargeable battery 189 does not change by more than a certain amount over a certain time period, the processor 120 can identify that the rechargeable battery 189 has been left unattended for a long enough period of time. For example, processor 120 can detect if the rechargeable battery 189 voltage level does not change by more than 10 my in from the time empirically known to charge the rechargeable battery 189 to 95% to the time empirically known to charge the battery 189 to 100% from 95%.

The section in which the voltage of the rechargeable battery 189 is maintained within the range of levels lower than the target voltage level will be called a "sideway-drifting section." The sideway-drifting section may include not only a section where the voltage is kept constant, but also a section where the voltage is slightly varied (increased or decreased) within a predetermined level or rate (voltage increasing per time).

For example, as the electronic device 101 is stored in stock for a long period of time after released, the rechargeable battery 189 may be stored for that period of time or left unattended for that period of time.

When the rechargeable battery 189 to be charged is decrepit as it is left unattended for a long period of time as described above, there are no or few histories charging the rechargeable battery 189 and therefore the processor 120 may, for example, control the rechargeable battery 189 to be charged based on a target voltage level of 4.38 V set corresponding to the number of charging times 1~299 shown in the Table 1. However, the rechargeable battery 189 may be damaged or deteriorated as being unattended for a long period of time, and therefore may not be charged with the corresponding target voltage level of 4.38V. Thus, the rechargeable battery 189 may no longer increase but may be maintained within a range of levels lower than the target voltage level.

Referring to FIG. 5, the voltage 510 gradually increasing from a charging start point t50 does not reach the target voltage level but is kept approximately constant in a section t51-t52 (i.e., a time section). In this case, the processor 120 may identify the section where the voltage is maintained, for example, the section t51-t52 as the sideway-drifting section.

On the other hand, referring to FIG. 6, when the rechargeable battery 189 is not a rechargeable battery left unattended for a long period of time but a normal rechargeable battery, the voltage of the rechargeable battery is continuously increased even in a section of t61-t62 without the sideway-drifting section.

According to an embodiment, when the voltage of the rechargeable battery 189 reaches a previously set percentage of the target voltage level, for example, 95%, the processor 120 may identify a section where the voltage of the rechargeable battery 189 is steady, in other words, the sideway-drifting section. This percentage may be previously set based on data built by measuring the charged percentages of the batteries left attended for a long period of time.

Referring back to FIG. 4, at operation 412, the processor 120 according to an embodiment may detect the dynamic scaling in which the charged-amount identification value is increased in the state that the voltage of the rechargeable battery 189 does not reach the target voltage level after the sideway-drifting section.

Referring to FIG. 5, The processor 120 may detect the dynamic scaling in which the charged-amount identification value is increased as the state-of-charge (SOC) of the rechargeable battery 189 in a section t52-t53 after the section t51-t52 corresponding to the sideway-drifting section.

As time elapses after the product is manufactured, the actual voltage of the rechargeable battery 189 may, for example, no longer increase after the charged amount reaches the chargeable capacity (e.g., 95%) of the rechargeable battery 189 at the point t51.

The processor 120 may detect occurrence of the dynamic scaling, in which the charged-amount identification value is increased, in the state that the voltage of the rechargeable battery 189 does not reach the target voltage level as described above.

The processor 120 may control the display 210 to display the notation charged amount (e.g., the charged percentage) based on the charged-amount identification value, in other words, the SOC of the rechargeable battery 189.

The processor 120 may, for example, control the notation charged amount, for example, the charged percentage of the UI 711, 712 displayed on the display 210 to be increased based on the charged-amount identification value corresponding to the dynamic scaling. Referring to FIG. 7, the processor 120 according to an embodiment may control the notation charged amount, for example, the charged percentage of the UI 712 based on the charged-amount identification value of the rechargeable battery 189 to be rapidly increased up to 100% corresponding to the target voltage level and displayed as a state-of-full charge.

Referring to FIG. 5, for example, the rechargeable battery voltage 510 (i.e., the measured voltage) no longer increases. The rechargeable battery voltage 510 does not reach the target voltage with respect to the point t52 after the sideway-drifting section. However, the expected voltage may increase when the voltage of the rechargeable battery 189 does not reach the target voltage level. Based on the expected voltage increased as above, the expected percentage charged amount 520 (the percentage of the expected voltage to the target voltage) of the UI 711, 712 may be displayed on the display 210 of the electronic device 101.

According to the disclosure, the section in which the voltage of the rechargeable battery 189 no longer increases but the expected percentage charged is increased will be called a "dynamic scaling section." In the graph 500 of FIG. 5, the section t52-t53 may, for example, correspond to the dynamic scaling.

The displayed charged amount on the UI 711, 712 may be increased by a preset percentage per time (based on the charged-amount identification value in the dynamic scaling section). The following Table 2 shows that the displayed charged amounts to be displayed are increased while the rechargeable battery voltage remains the same.

TABLE 2

| Time | Notation charged amount (%) | Rechargeable battery voltage (mV) | Charging current (mA) |
|---|---|---|---|
| 14:02:07 | 95 | 4187 | 291 |
| 14:02:37 | 96 | 4186 | 278 |
| 14:02:37 | 96 | 4186 | 278 |
| 14:03:08 | 96 | 4185 | 278 |
| 14:03:08 | 97 | 4185 | 278 |
| 14:03:39 | 97 | 4185 | 257 |
| 14:03:39 | 98 | 4185 | 257 |
| 14:04:10 | 98 | 4186 | 280 |
| 14:04:10 | 99 | 4186 | 280 |
| 14:04:41 | 99 | 4186 | 280 |
| 14:04:41 | 100 | 4186 | 257 |

Referring to the Table 2, the processor 120 may detect the dynamic scaling in which the rechargeable battery voltage 510, i.e., the measured voltage no longer increases after the displayed charged amount reaches, for example, 95%, but the charged-amount identification value is increasing. Corresponding to the dynamic scaling, the displayed charged amount 520, in other words, the charged percentage on the UI 711, 712 may, for example, be increased by 1% every about 30 seconds as shown in the Table 2.

FIG. 5 shows that the voltage 520 corresponding to the charged-amount identification value in the section t52-t53 is rapidly increased as compared to that in the section t50-t51, i.e., the charging section of the rechargeable battery 189, in other words, shows the dynamic scaling.

The processor 120 according to an embodiment may, for example, control the charged percentage item or the battery-shaped icon to be displayed as shown in FIG. 7, showing the fully charged state (e.g., 100%) of the rechargeable battery 189 as the notation charged amount 520 of the UI 712 based on the charged-amount identification value.

On the other hand, referring to FIG. 6, in case of a normal rechargeable battery, the battery voltage 610 continuously increases up to the target voltage level without rapid increase even in a section t62-t63. In other words, the normal rechargeable battery continues to increase during, for example, the section t62-t63 without the sideway-drifting section or the dynamic scaling, and is fully charged at the point t63 at which the target voltage level is achieved, thereby allowing the notation charged amount on the UI to indicate the fully charged state (e.g., 100%).

Referring back to FIG. 4, at operation 413, the processor 120 according to an embodiment may identify that the rechargeable battery 189 is not chargeable up to the target voltage level, in other words, that the rechargeable battery 189 is a rechargeable battery left unattended for a long period of time or a decrepit rechargeable battery based on the dynamic scaling detected in the operation 412.

At operation 414, the processor 120 according to an embodiment may perform control to stop (suspend) charging the rechargeable battery 189 identified in the operation 412 as the rechargeable battery left unattended for a long period of time. The processor 120 stops charging the rechargeable battery 189 in the operation 414, thereby preventing a product liability (PL) accident or the like due to the rechargeable battery left unattended for a long period of time.

The processor 120 may detect the dynamic scaling, in which the charged-amount identification value increases, as the characteristics of the rechargeable battery. In other words, while controlling the charge of the rechargeable battery 189, the processor 120 may identify that the rechargeable battery 189 is a rechargeable battery which is left unattended for a long period of time and thus not chargeable up to the target voltage level, for example, based on the dynamic scaling detected in the section t53-t54 or the like, and control the power management module 188 to stop charging the rechargeable battery 189.

Meanwhile, according to an alternative embodiment, the processor 120 may identify that the rechargeable battery 189 is not chargeable up to the target voltage level, based on the sideway-drifting section detected in the operation 412. In other words, the processor 120 may identify that the rechargeable battery 189 is a rechargeable battery left unattended for a long period of time or a decrepit rechargeable battery based on the detected sideway-drifting section, in which the voltage of the rechargeable battery 189 according to the charging control is maintained within a range of levels lower than the target voltage level, and perform control to stop charging the rechargeable battery 189. In other words, the processor 120 according to an alternative embodiment may employ the detection of the sideway-drifting section as the characteristics of the rechargeable battery left unattended for a long period of time.

At operation 415 the processor 120 according to an embodiment may perform a protecting operation for the rechargeable battery 189.

There are no limits to the kinds of the protecting operations, and the protecting operation may, for example, include outputting a warning message through the display 210, the sound output module 155, etc. provided in the electronic device 101 itself, or outputting a warning message, for example, a UI, a sound, etc. through the external electronic device 102, 104 connected through the communication module 190.

Alternatively, the protecting operation performed in the operation 415 may include changing (e.g., downwardly adjusting) the target voltage level. In other words, as the protecting operation for the rechargeable battery 189, the processor 120 may change (e.g., downwardly adjust) the target voltage level for full charge/complementary charge to correspond to the state-of-charge (see '510' in FIG. 5) of the rechargeable battery 189.

Alternatively, the protecting operation performed in the operation 415 may include the call balancing of the battery protection circuit 350.

Referring to FIG. 8, the processor 120 according to an embodiment may control the display 210 to display a UI 811, 812 showing a battery warning or charging interruption of the rechargeable battery 189. The form and content of the UI 811, 812 according to the disclosure are not limited to those shown in FIG. 8. For example, a UI may be displayed to guide a visit to a customer service center (contact information, location guidance, etc.) may be displayed. The processor 120 may control the sound output module 155 to output a voice or sound for informing the charging interruption of the rechargeable battery 189 or the battery warning.

Meanwhile, the processor 120 according to an embodiment may control the rechargeable battery 189 to continue to be charged when the dynamic scaling is not detected with respect to the displayed charged amount.

Accordingly, as shown in FIG. 6, according to the charging control, the voltage 610 of the rechargeable battery is gradually increased up to the target voltage level throughout the section t60-t63. Further, the rechargeable battery is fully charged at the point t63 at which the target voltage level is achieved, and the notation charged amount on the UI may show the fully charged state (e.g., 100%).

Meanwhile, The processor 120 may further use a charging current as the characteristics of the rechargeable battery left unattended for a long period of time. The charging current may, for example, refer to a level of electric current flowing from a charger to the terminal of the rechargeable battery 189.

Referring to FIGS. 5 and 6, in an initial section, the rechargeable battery 189 may be charged with a constant current having a constant level, i.e., a charging current 530, 630. Referring to FIG. 5, in case of a rechargeable battery left unattended for a long period of time, a current may fluctuate in a constant-current section. When the current fluctuates in the constant-current section, the processor 120 may identify that the rechargeable battery 189 has been left unattended for a long time like the operation 413, stop charging the rechargeable battery 189 like the operation 414, and perform the protecting operation for the rechargeable battery 189 like the operation 415.

Figure 9:
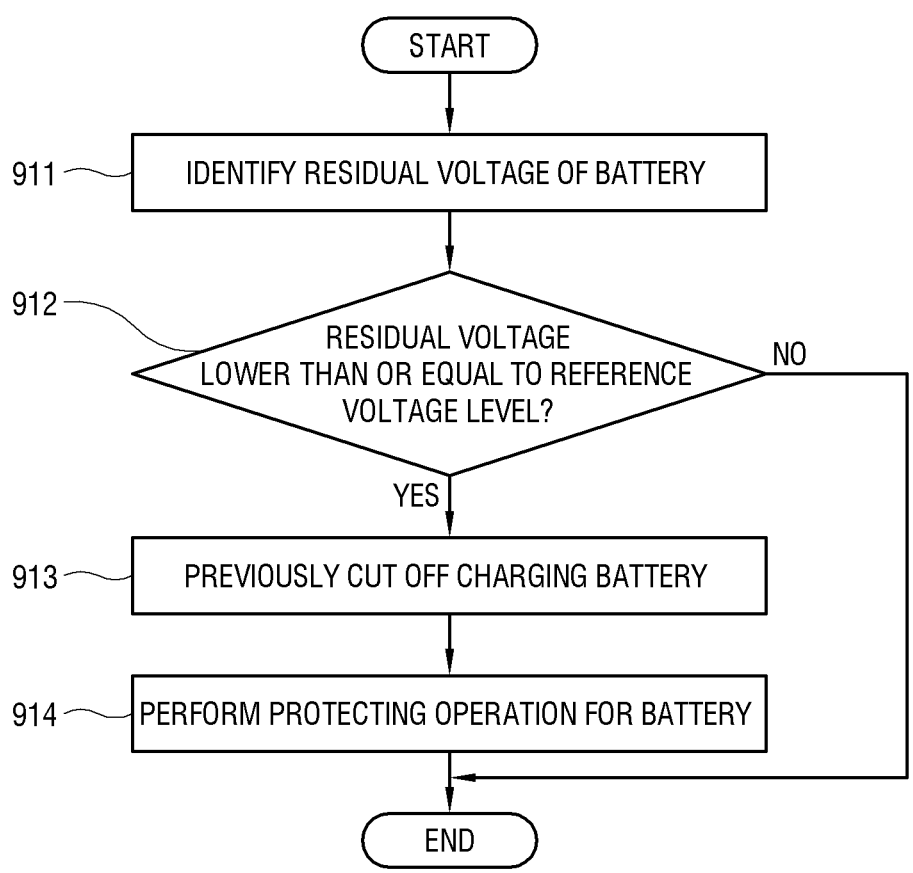
FIG. 9 is a flowchart showing a method of performing a protecting operation for a rechargeable battery in an electronic device according to a second embodiment of the disclosure.
Figure 10:
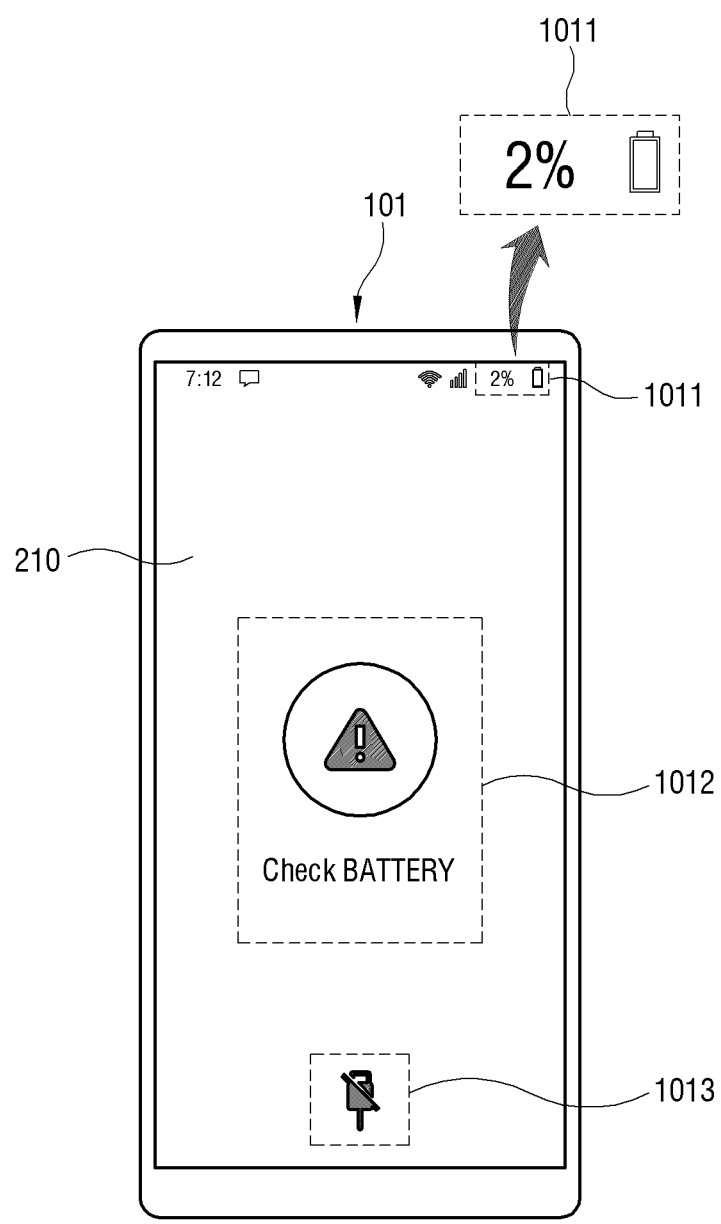
FIG. 10 illustrates a protecting operation for a rechargeable battery in an electronic device according to an embodiment of the disclosure.

FIG. 9 is a flowchart showing a method of performing a protecting operation for a rechargeable battery in an electronic device according to a second embodiment of the disclosure. FIG. 10 illustrates a protecting operation for a rechargeable battery in an electronic device according to an embodiment of the disclosure.

Referring to FIG. 9, at operation 911, the processor 120 of the electronic device 101 according to an embodiment may identify the residual voltage of the rechargeable battery 189.

When the electronic device 101 has been left unused for a long period of time, for example, about 1 year and six months to 2 years after released, the rechargeable battery 189 released as charged up to about 60% of its total capacity may be over-discharged due to leakage current and the like causes. The following Table 3 shows examples of time (14.4 months, 17.35 months) it takes for the batteries of released products A21 and A51 to be over-discharged (e.g., down to 2.1V).

TABLE 3

| Time (month) it takes for released rechargeable battery to be over-discharged (down to 2. 1 V) | |
|---|---|
| A21 (3600 mAh) | A51 (4500 mAh) |
| 14.4 | 17.35 |

The processor 120 may identify the residual voltage by detecting a cell voltage of the rechargeable battery 189. According to the second embodiment, the processor 120 may employ the residual voltage as the characteristics of the rechargeable battery left unattended for a long period of time.

At operation 912 the processor 120 according to an embodiment may identify whether the residual voltage of the rechargeable battery identified in the operation 911 is lower than or equal to a reference voltage level set corresponding to a discharge of a rechargeable battery stored for a long period of time. The reference voltage level may be previously set based on a database built by measuring the residual voltage to which the batteries stored or left unattended for a long period of time, for example, 2 or more years are discharged. The reference voltage level may, for example, be set to 2.1 V, but is not limited thereto.

Referring to FIG. 10, when the residual voltage of the rechargeable battery 189 has a level lower than or equal to the reference voltage level, a notation charged amount on a UI 1011 may indicate an over-discharged or low-power state.

Referring to FIG. 9, at operation 913, the processor 120 according to an embodiment may perform control to previously cut off charging the rechargeable battery 189 based on the residual voltage identified in the operation 912 as having a level lower than or equal to the reference voltage level. The processor 120 may, for example, control the battery protection circuit 350 not to charge the rechargeable battery 189 even though the electronic device 101 is connected to an external charging source (e.g., a charger).

At operation 914 the processor 120 according to an embodiment may perform control to perform the protecting operation for the rechargeable battery 189. There are no limits to the kinds of the protecting operations, and the protecting operation may, for example, include outputting a warning message through the display 210, the sound output module 155, etc. provided in the electronic device 101 itself, or outputting a UI, a sound or the like warning message through the external electronic device 102, 104 connected through the communication module 190. Alternatively, the protecting operation may include cell balancing based on the battery protection circuit 350.

The processor 120 according to an embodiment may control the display 210 to display a UI 1012, 1013 showing a rechargeable battery warning or charging interruption of the rechargeable battery 189. The form and content of the UI 1012, 1013 according to the disclosure are not limited to those shown in FIG. 10. For example, a UI may be displayed to guide a visit to a customer service center (contact information, location guidance, etc.) may be displayed. The processor 120 may control the sound output module 155 to output a voice or sound for informing the charging interruption of the rechargeable battery 189 or the battery warning.

Figure 11:
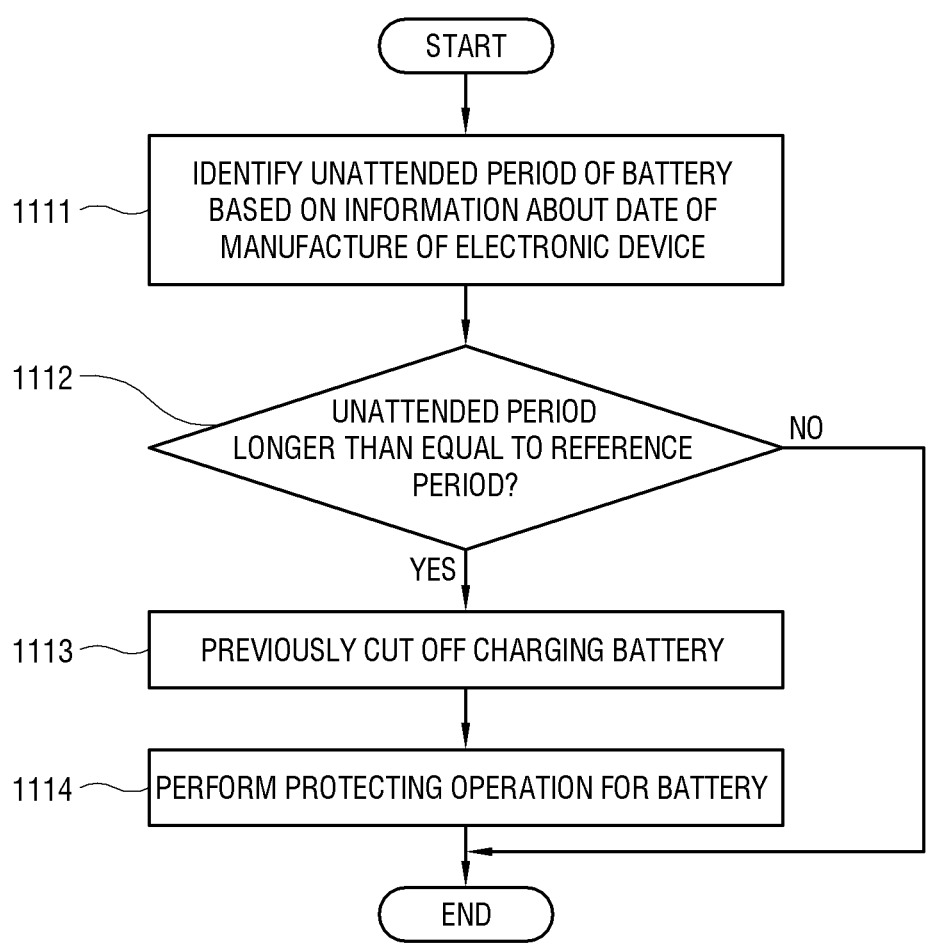
FIG. 11 is a flowchart showing a method of performing a protecting operation for a rechargeable battery in an electronic device according to a third embodiment of the disclosure.

FIG. 11 is a flowchart showing a method of performing a protecting operation for a rechargeable battery in an electronic device according to a third embodiment of the disclosure.

Referring to FIG. 11, at operation 1111, the processor 120 of the electronic device 101 according to an embodiment may identify how long the rechargeable battery 189 has been left unattended based on information about the date when the electronic device 101 was manufactured. The information about the date when the electronic device 101 was manufactured may be previously stored in the memory 130, and a timer or the like may be used to measure an unattended period of time.

The date of manufacture of the electronic device 101 is regarded as the date of manufacture of the rechargeable battery 189. Alternatively, the processor 120 may obtain information about the data of manufacture of the rechargeable battery 189 from the memory 130, and identify how long the rechargeable battery 189 has been left unattended.

At operation 1112, the processor 120 according to an embodiment identifies whether the unattended period of the rechargeable battery 189 identified in the operation 1111 is longer than or equal to a preset reference period. The reference period may be previously set based on a database built by collecting histories of accidents caused as the batteries are left unattended for a long period of time (e.g., an accident history database). The unattended period may, for example, be defined as a period from the date of manufacture of the product to the start of use of the product. The rechargeable battery 189 may, for example, cause an accident and raise concerns about a customer's safety or the like when it is left unattended for 15 or more months from the date of manufacture of the product. At operation 1112, the reference period may, for example, be set to 14 months, but is not limited thereto. According to the third embodiment, the processor 120 may employ the unattended period as the characteristics of the rechargeable battery left unattended for a long period of time.

At operation 1113, the processor 120 according to an embodiment may perform control to previously cut off charging the rechargeable battery 189 based on the unattended period identified in the operation 1112 as longer than or equal to the reference period. The processor 120 may, for example, control the battery protection circuit 350 not to charge the rechargeable battery 189 even though the electronic device 101 is connected to an external charging source (e.g., a charger).

At operation 1114, the processor 120 according to an embodiment may perform control to perform the protecting operation for the rechargeable battery 189. There are no limits to the kinds of the protecting operations, and the protecting operation may, for example, include outputting a warning message through the display 210, the sound output module 155, etc. provided in the electronic device 101 itself, or outputting a UI, a sound or the like warning message through the external electronic device 102, 104 connected through the communication module 190. Alternatively, the protecting operation may include cell balancing based on the battery protection circuit 350.

Figure 12:
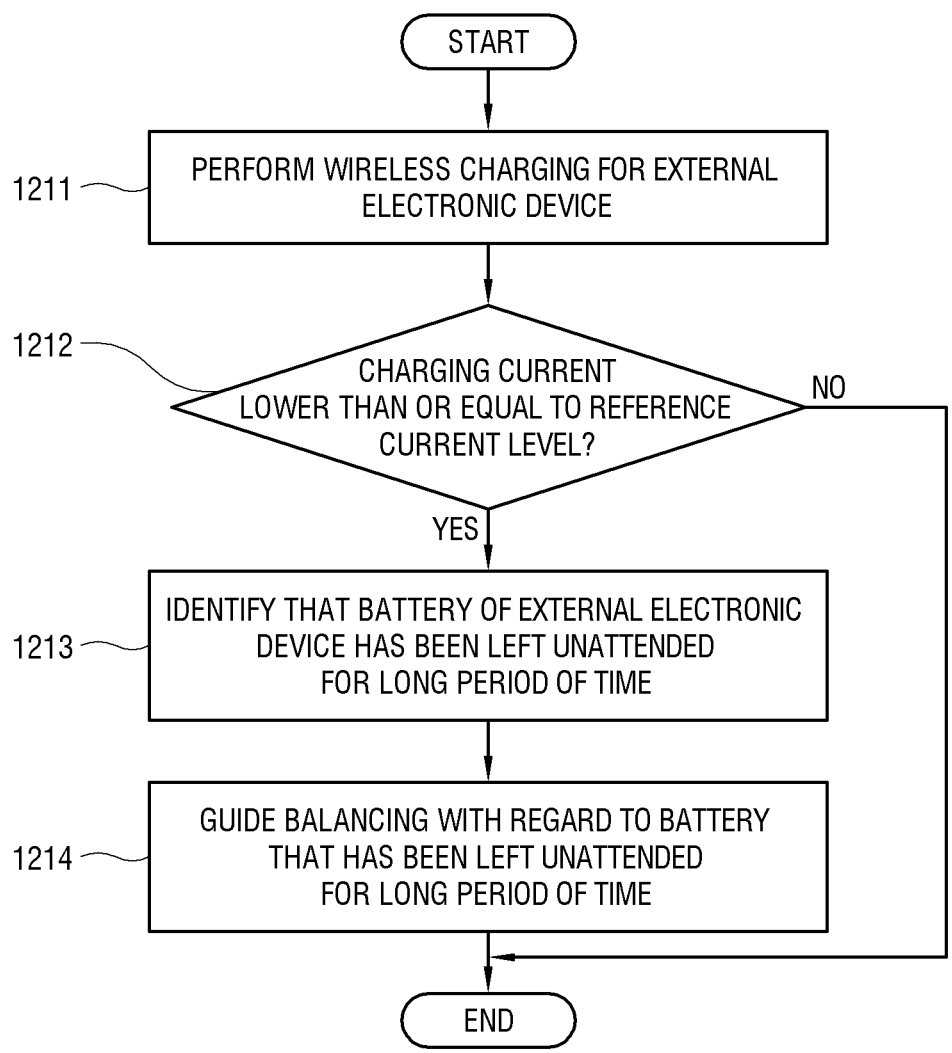
FIG. 12 is a flowchart showing a method of performing a protecting operation for a rechargeable battery in an electronic device according to a fourth embodiment of the disclosure.
Figure 13:
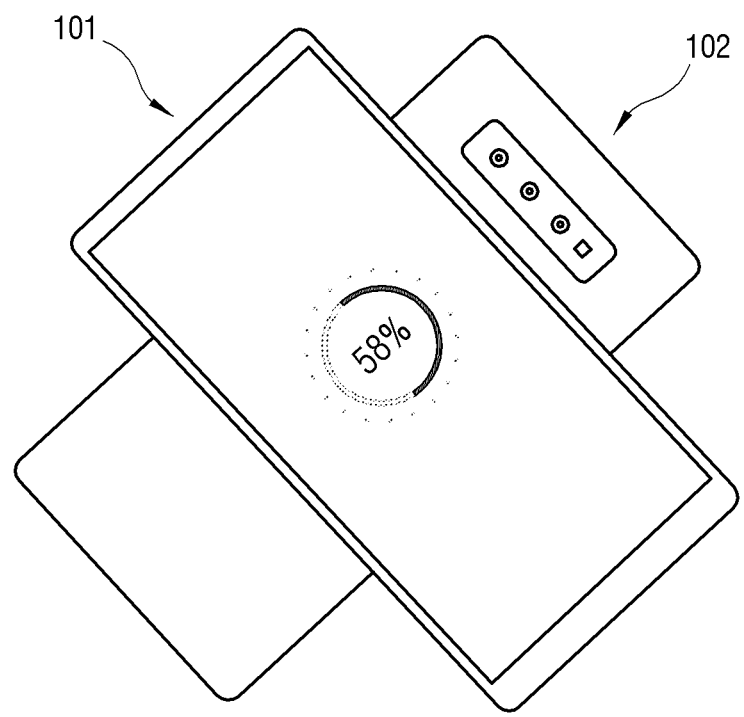
FIG. 13 illustrates wireless charging according to an embodiment of the disclosure.
Figure 14:
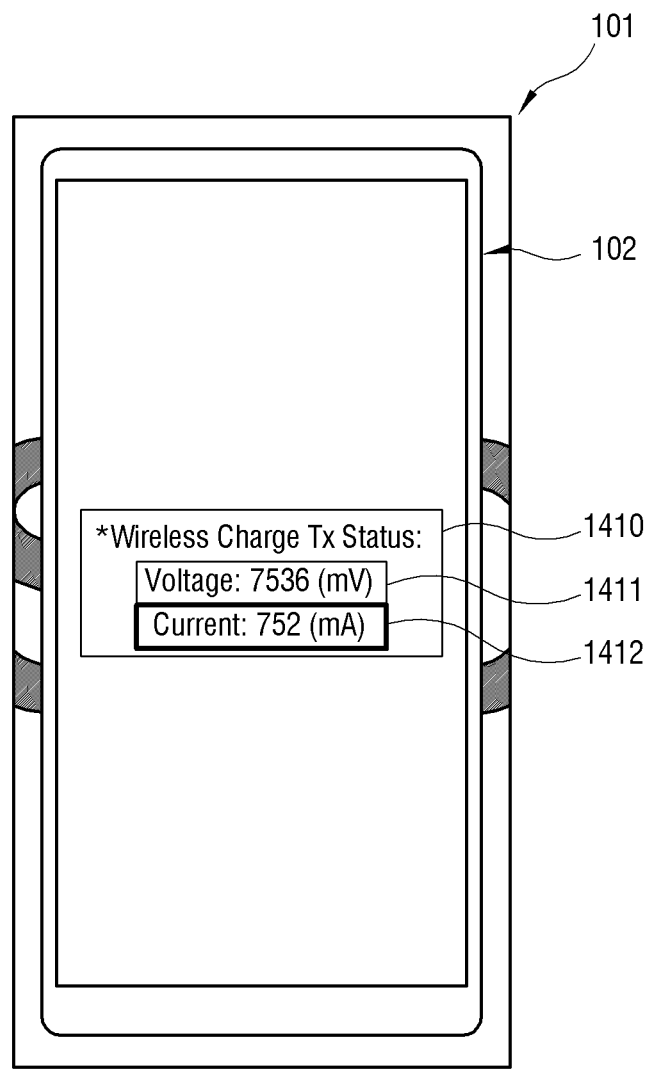
FIGS. 14 and 15 illustrate wireless charging information displayed according to an embodiment of the disclosure.
Figure 15:
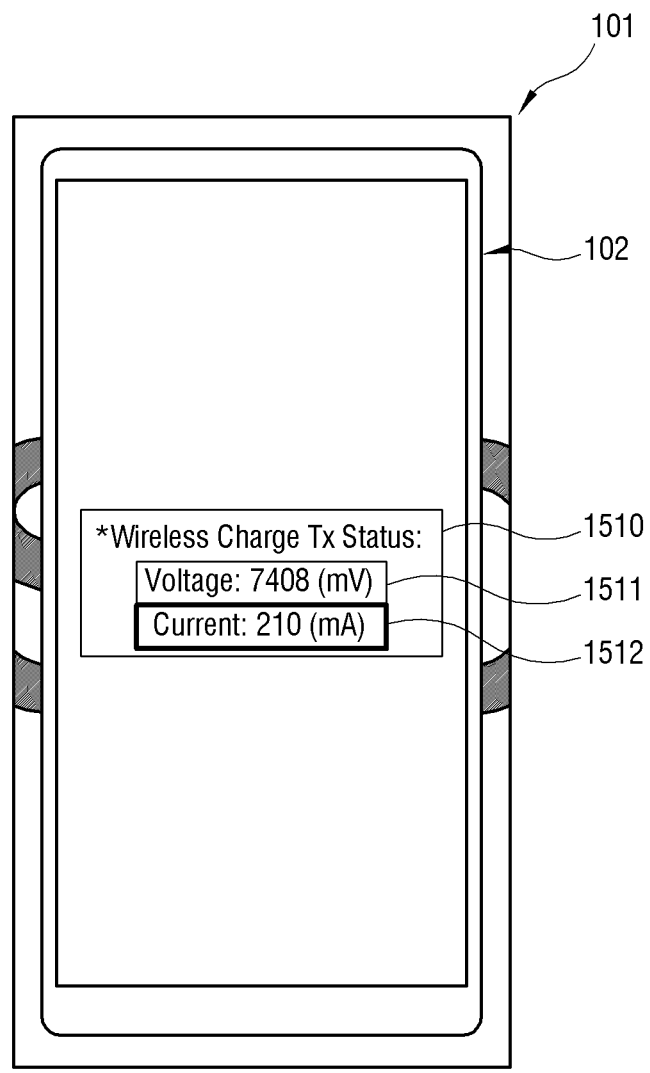

FIG. 12 is a flowchart showing a method of performing a protecting operation for a rechargeable battery in an electronic device according to a fourth embodiment of the disclosure. FIG. 13 illustrates wireless charging according to the embodiment of the disclosure. FIGS. 14 and 15 illustrate wireless charging information displayed according to the fourth embodiment of the disclosure.

According to the fourth embodiment, with respect to the rechargeable battery 189 mounted to the electronic device 101, based on wireless charging with power supplied from another electronic device 102, the transmitting-side (Tx) electronic device 102 is configured to identify the characteristics of the rechargeable battery 189 mounted to the receiving-side (Rx) electronic device 101.

Referring to FIG. 12, at operation 1211, the processor 120 of the electronic device 102 according to an embodiment may perform the wireless charging for the external electronic device 101 mounted with the rechargeable battery 189.

Referring to FIG. 13, a user may bring both the electronic devices 101 and 102 close to each other, and then make the rechargeable battery 189 of the receiving-side electronic device 101 be charged based on the wireless charging of device to device (D2D) (e.g., phone to phone). Here, the electronic device 102 may, as shown in FIGS. 14 and 15, supply power for the wireless charging to the external electronic device 101 as it is in a factory packaging state.

The processor 120 of the electronic device 102 may display wireless-charging information (i.e., status information) on the display 210 of the electronic device 102 while performing the wireless charging.

Referring to FIGS. 14 and 15, UIS 1410 and 1510 including the wireless charging information such as charging voltages 1411 and 1511 and charging currents 1412 and 1512 transmitted at the transmitting-side may be displayed on the display 210 of the transmitting-side electronic device 102. Alternatively, the UI including the wireless charging information may be displayed on the display of the receiving-side electronic device 101.

Referring back to FIG. 12, at operation 1212, the processor 120 of the electronic device 102 according to an embodiment may identify whether the charging current transmitted in the operation 1211 has a level lower than or equal to a preset reference current level. The reference current level may be set as a level used for the safety of the wireless charging with regard to a low-voltage or over-discharged battery. The reference voltage level may, for example, be set to 300 mA, but not limited thereto.

According to an embodiment the wireless charging module 340 may adjust the level of the transmitted charging current to a low current level when the rechargeable battery to be charged is left unused for a long period of time and thus has a very low voltage level. For example, when the rechargeable battery 189 of the receiving-side electronic device 101 is left unattended for a long period of time and thus not chargeable up to the target voltage level, the charging current 1511 may be adjusted to have a very low level of 210 mA as shown in FIG. 15. On the other hand, in case of a normal rechargeable battery, the charging current 1411 is not adjusted as shown in FIG. 14. In other words, according to the fourth embodiment, the processor 120 may employ the charging current as the characteristics of the rechargeable battery left unattended for a long period of time.

The electronic device 102 may be installed with a dedicated application which can identify whether a rechargeable battery has been left unattended for a long period of time based on the wireless charging. FIGS. 14 and 15 illustrate that the wireless-charging information is displayed as the dedicated application is executed.

At operation 1213 of FIG. 12, the processor 120 of the electronic device 102 according to an embodiment may identify that the rechargeable battery 189 of the external electronic device 101 is a rechargeable battery not chargeable up to the target voltage level, in other words, a rechargeable battery left unattended for a long period of time, based on the charging current identified in the operation 1212 as being lower than or equal to the reference current level.

At operation 1214, the processor 120 of the electronic device 102 according to an embodiment may guide the electronic device 101 to perform balancing (e.g., the cell balancing) or replace the rechargeable battery, as the protecting operation for the rechargeable battery left unattended for a long period of time 189.

In the operation 1214, the processor 120 of the electronic device 102 according to an embodiment may, for example, output a guidance message through the display 210, the sound output module 155 or the like provided in the electronic device 102 itself. Based on the guidance message, a user may unpack the electronic device 101, perform balancing for the rechargeable battery 189 or replacement of the rechargeable battery 189, and then repack the electronic device 101 for release.

According to the fourth embodiment, it is possible to identify whether the rechargeable battery 189 of the packaged electronic device 101 is normal or abnormal, and it is thus advantageous to prevent accidents through a quick and efficient battery check.

The electronic device according to certain embodiments of the disclosure may include various types of apparatuses. The electronic device may, for example, include a mobile communication device (e.g., a smartphone), a computer device, a portable multimedia device, a portable medical device, a camera, a wearable device, or home appliances. The electronic device according to an embodiment of the disclosure is not limited to the foregoing devices.

Certain embodiments of the disclosure and terms used therein are not intended to limit the technical features described in the disclosure, but required to be construed as including various modifications, equivalents or substitutions of the embodiments. In connection with the description of the drawings, like reference numerals may refer to similar or related elements. A singular form of a noun corresponding to an item may include one item or a plurality of items unless otherwise contextually indicated clearly. In this disclosure, "A or B", "at least one of A and B", "at least one of A or B", "A, B or C", "at least one of A, B and C", and "at least one of A, B, or C" and the like phrase may include any one of items listed together in the corresponding phrase, or all possible combinations thereof "first", "second", and the like terms may be used only for distinguishing an element from other elements, and these elements are not restricted in other aspects (e.g., importance or order). When it is mentioned that one (e.g., first) element is "coupled" or "connected" to another (e.g., second) element with or without terms of "functionally" or "communicatively", it means that one element can be connected to another element directly (e.g., by a wire), wirelessly, or through a third element.

The term "module" used in certain embodiments of the disclosure may include a unit embodied in hardware, software or firmware, and is interchangeable with the terms such as, for example, logic, logic block, parts, or circuit. The module may be an integrally formed element, or a minimum unit of the element or a part of the minimum unit, which performs one or more functions. For example, The module may be embodied in the form of an application-specific integrated circuit (ASIC).

Certain embodiments of the disclosure may be carried out by software (e.g., the program 140) including one or more instructions stored in a storage medium (e.g., an internal memory 136 or an external memory 138) readable by a machine (e.g., the electronic device 101). For example, the processor (e.g., the processor 120) of the machine (e.g., the electronic device 101) may call at least one instruction among one or more stored instructions from the storage medium, and execute the called instruction. This makes it possible for the machine to perform at least one function according to the at least one called instruction. The one or more instructions may include a code generated by a compiler or a code executable by an interpreter. The machine-readable storage medium may be provided in the form of a non-transitory storage medium. Here, 'non-transitory' merely means that the storage medium is tangible and does not include a signal (e.g., an electromagnetic wave), without distinguishing between a case where data is semi-permanently stored in the storage medium and a case where data is temporarily stored.

According to an embodiment, methods according to certain embodiments of the disclosure may be provided as involved in a computer program product. The computer program product may be traded as a product between a seller and a buyer. The computer program product may be distributed in the form of a machine-readable storage medium (for example, a compact disc read only memory (CD-ROM)) or may be directly or online distributed (for example, downloaded or uploaded) between two user apparatuses (for example, smartphones) through an application store (for example, Play Store™). In the case of the online distribution, at least part of the computer program product may be transitorily stored or temporarily produced in a machine-readable storage medium such as a memory of a manufacturer server, an application-store server, or a relay server.

According to certain embodiments, each element (e.g., the module or the program) of the foregoing elements may include a singular entity or a plurality of entities, and some among the plurality of entities may be separated and disposed in another element. According to certain embodiments, one or more elements among the foregoing elements or operations may be omitted, or one or more other elements or operations may be added. Alternatively or additionally, a plurality of elements (e.g., the module or the program) may be integrated into a single element. In this case, the integrated element may perform one or more functions of the element among the plurality of elements equally or similarly to those performed by the corresponding element among the plurality of elements before the integration. According to certain embodiments, operations performed by the module, the program or other elements may be executed in sequence, in parallel, repetitively, or heuristically, or one or more among the foregoing operations may be performed in different order, be omitted or additionally include one or more other operations.

Although a few exemplary embodiments of the disclosure have been described in detail, various changes may be made in these exemplary embodiments without departing from the scope defined in the appended claims.

The invention claimed is:

1. An electronic device comprising:
   a rechargeable battery configured to supply power to the electronic device;
   a processor connected to the battery; and
   memory storing a plurality of executable instructions, wherein the execution of the executable instructions by the processor causes performing a plurality of operations, wherein the plurality of operations comprises:
   charging the battery based on a target voltage level, wherein the target voltage level is based on a number of times the rechargeable battery has been previously charged,
   detecting a time period in which the voltage of the rechargeable battery is varied within a predetermined rate after reaching a previously set percentage of the target voltage level while charging the rechargeable battery,
   in response to detecting the time period, identifying the rechargeable battery as being left unused and not charged for a long period of time, and
   performing protecting operation for the rechargeable battery, wherein the protecting operation comprising downwardly adjusting the target voltage level for the rechargeable battery.

2. The electronic device of claim 1, wherein detecting the time period comprises detecting the time period in which the voltage has not changed in excess of a predetermined threshold over a certain period of time.

3. The electronic device of claim 1, further comprising a display,
   wherein the processor is configured to display a user interface (UI) indicating a charged proportion of the battery, wherein the UI indicates a fully charged state of the rechargeable battery after reaching the previously set percentage of the target voltage level.

4. The electronic device of claim 1, further comprising a display, wherein the processor is configured to control the display to display an indicator indicating a charged proportion of the rechargeable battery, and wherein the indicator is increased a preset percentage per a given unit time after reaching the previously set percentage of the target voltage level.

5. The electronic device of claim 1, further comprising a display,
   wherein the processor performs the protecting operation for the rechargeable battery by controlling the display to display a user interface (UI) showing charging interruption of the battery or a battery warning.

6. An electronic device comprising:
   a wireless charging module configured to wirelessly transmit power; and
   a processor configured to:
   perform wireless charging for a rechargeable battery of an external apparatus through the wireless charging module, and
   detecting a time period in which the voltage of the rechargeable battery is varied within a predetermined rate after reaching a previously set percentage of a target voltage level based on identification that a charging current for the wireless charging is lower than or equal to a preset reference current level during the wireless charging, wherein the preset reference current level is set as a level used for safety of the wireless charging with regard to a low-voltage or over-discharged battery, identifying the rechargeable battery of the external apparatus as being left unused and not charged for a long period of time, and performing protecting operation for the rechargeable battery of the external apparatus, wherein the protecting operation comprising downwardly adjusting the target voltage level for the rechargeable battery.

7. The electronic device of claim 6, further comprising a display, wherein the processor performs the protecting operation for the battery of the external apparatus by controlling the display to output a user interface (UI) indicating that the rechargeable battery of the external apparatus needs to be replaced.

8. A method of controlling an electronic device, comprising:

charging a rechargeable battery based on a target voltage level, wherein the target voltage level is based on a number of times the rechargeable battery has been previously charged;

detecting a time period in which the voltage of the rechargeable battery is varied within a predetermined rate after reaching a previously set percentage of the target voltage level while charging the rechargeable battery, in response to detecting the time period, identifying the rechargeable battery as being left unused and not charged for a long period of time; and performing protecting operation for the rechargeable battery, wherein the protecting operation comprising downwardly adjusting the target voltage level for the rechargeable battery.

9. The method of claim 8, wherein detecting the time period comprises detecting the time period in which the voltage has not changed in excess of a predetermined threshold over a certain period of time.

10. The method of claim 8, further comprising displaying a user interface (UI) indicating a charged proportion of the battery, wherein the UI indicates a fully charged state of the battery after reaching the previously set percentage of the target voltage level.

11. The method of claim 8, further comprising displaying an indicator indicating a charged proportion of the rechargeable battery, and wherein the indicator is increased a preset percentage per a given time after reaching the previously set percentage of the target voltage level.

12. A method of controlling an electronic device, comprising:

performing wireless charging for a rechargeable battery of an external apparatus;

detecting a time period in which the voltage of the rechargeable battery is varied within a predetermined rate after reaching a previously set percentage of a target voltage level based on identification that a charging current for the wireless charging is lower than or equal to a preset reference current level, wherein the preset reference current level is set as a level used for safety of the wireless charging with regard to a low-voltage or over-discharged battery;

identifying the rechargeable battery of the external apparatus as being left unused and not charged for a long period of time; and performing protecting operation for the rechargeable battery of the external apparatus, wherein the protecting operation comprising downwardly adjusting the target voltage level for the rechargeable battery.

* * * * *